(12) United States Patent
Son et al.

(10) Patent No.: US 11,515,383 B2
(45) Date of Patent: Nov. 29, 2022

(54) DISPLAY DEVICE

(71) Applicant: Samsung Display Co., Ltd., Yongin-Si (KR)

(72) Inventors: Dong Hyun Son, Seoul (KR); Seung Hwan Cho, Yongin-si (KR); Dong Won Kim, Seoul (KR); Min Yeul Ryu, Suwon-si (KR); Ki Ho Bang, Hwaseong-si (KR); Nak Cho Choi, Yongin-si (KR)

(73) Assignee: Samsung Display Co., Ltd.

( * ) Notice: Subject to any disclaimer, the term of this patent is extended or adjusted under 35 U.S.C. 154(b) by 176 days.

(21) Appl. No.: 17/109,000

(22) Filed: Dec. 1, 2020

(65) Prior Publication Data

US 2021/0265448 A1 Aug. 26, 2021

(30) Foreign Application Priority Data

Feb. 21, 2020 (KR) .................. 10-2020-0021351

(51) Int. Cl.
*H01L 27/32* (2006.01)
*G09G 3/3233* (2016.01)

(52) U.S. Cl.
CPC ...... *H01L 27/3276* (2013.01); *H01L 27/3223* (2013.01); *G09G 3/3233* (2013.01); *H01L 2227/323* (2013.01)

(58) Field of Classification Search
CPC ............ H01L 27/3276; H01L 27/3223; G09G 3/3258; G09G 3/3233
See application file for complete search history.

(56) References Cited

U.S. PATENT DOCUMENTS

| 2019/0206976 A1* | 7/2019 | Jeong .................. H01L 27/3246 |
| 2019/0278145 A1* | 9/2019 | Tanaka .............. G02F 1/133553 |

FOREIGN PATENT DOCUMENTS

| CN | 109541865 A | 3/2019 |
| JP | 2013-040981 A | 2/2013 |
| KR | 10-2018-0063938 A | 6/2018 |
| KR | 10-2021-0105478 A | 8/2021 |

* cited by examiner

*Primary Examiner* — Sardis F Azongha
(74) *Attorney, Agent, or Firm* — Innovation Counsel LLP

(57) ABSTRACT

A display device includes a substrate comprising an active area and a non-active area a first data conductive layer disposed on the substrate and including signal wires connected to pixels, a first insulating layer disposed on the first data conductive layer, a second data conductive layer disposed on the first insulating layer and including a connection wire connected to some of the signal wires and dummy wiring patterns disconnected the signal wires, a second insulating layer disposed on the second data conductive layer and a pixel electrode disposed on the second insulating layer. The dummy wiring patterns are separated from one another at a disconnection, the second insulating layer includes a second portion disposed on the disconnection and a third portion disposed on at least a portion of the connection wire, and thicknesses thereof are different from each other.

24 Claims, 30 Drawing Sheets

DISPLAY DEVICE

This application claims priority from Korean Patent Application No. 10-2020-0021351, filed on Feb. 21, 2020 in the Korean Intellectual Property Office, and the benefits accruing therefrom under 35 U.S.C. § 119, the disclosure of which is incorporated herein by reference in its entirety.

BACKGROUND

1. Field of the Disclosure

The present disclosure relates to a display device.

2. Description of the Related Art

Display devices become increasingly more important as multimedia technology evolves. Currently, various types of display devices such as organic light-emitting display (OLED) devices and liquid crystal display (LCD) devices are used.

A display device includes an active area in which images are displayed, and a non-active area disposed around the active area. Wires for providing signals to pixels arranged in the active area may be arranged in the non-active area. For example, the signal wires may fan out from a pad region and extend toward the active area.

Recently, display devices having a thin bezel has gained popularity. The non-active area in a display device having a thin bezel may not provide a sufficient area through which the fanned-out wires can pass.

SUMMARY

It may be contemplated that, in a thin bezel structure, some of fan-out wires pass through an active area. If the fan-out wires pass through the active area, however, the order of the data signals may be changed, and it may require additional mapping of the driving signals in a driving chip. In addition, signal wires may include different conductive layers for different regions. In such a case, it may cause a difference in luminance between different regions because of process deviations of the conductive layers.

Aspects of the present disclosure provide a display device in which connection wires pass through an active area and typical driving chips are employed. The display device can reduce a difference in luminance between areas that may be caused by process deviations of conductive layers.

Embodiments and advantages of the present disclosure will become apparent to those of ordinary skill in the art in accordance with the Detailed Description below.

According to an exemplary embodiment of the present disclosure, a display device includes connection wires passing through an active area, and dummy wiring patterns disposed in portions of the active area where the connection wires are not disposed. The dummy wiring patterns may be separated at the disconnections that may otherwise create level difference. The display device includes dummy grooves disposed above connection wires or dummy wiring patterns to suppress the level difference above the disconnections from being perceived.

According to an exemplary embodiment of the present disclosure, the dummy grooves disposed in the active area may form an uneven pattern similar to the level difference above the disconnections, so that it is possible to improve an issue that the difference in reflectance due to the level difference is perceived as a certain pattern.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an exemplary embodiment of the present disclosure, a display device includes a plurality of pixels; a substrate including an active area in which a plurality of pixels is disposed and a non-active area disposed on a side of the active area; a first data conductive layer disposed on the substrate and including a plurality of signal wires connected to the plurality of pixels; a first insulating layer disposed on the first data conductive layer; a second data conductive layer disposed on the first insulating layer and including a connection wire connected to some of the plurality of signal wires and a plurality of dummy wiring patterns that is disconnected from the plurality of signal wires; a second insulating layer disposed on the second data conductive layer; and a pixel electrode disposed on the second insulating layer, wherein the plurality of dummy wiring patterns are separated from one another at a disconnection, wherein the second insulating layer includes a first portion disposed on the dummy wiring patterns, a second portion disposed on the disconnection, and a third portion disposed on at least a portion of the connection wire, and wherein a second thickness of the second portion is different from a third thickness of the third portion.

An upper surface of the second insulating layer may have uneven patterns formed at the second portion and the third portion.

The third thickness of the third portion may be smaller than the second thickness of the second portion.

The second thickness of the second portion may be equal to a first thickness of the first portion, and the third portion may have a dummy groove that is recessed from a portion of the upper surface of the second insulating layer.

The second portion of the second insulating layer may include a recess formed on the upper surface, and a depth of the dummy groove may be equal to a depth of the recess.

The display device may further include an emissive layer disposed on the pixel electrode; and a common electrode disposed on the emissive layer, wherein the dummy groove may overlap the emissive layer in a thickness direction.

The first thickness of the first portion may be equal to the third thickness of the third portion, and the second portion may have a protruding pattern formed on the upper surface.

Each of the second portion and the third portion of the second insulating layer may include a protruding pattern formed on the upper surface, and the third thickness of the third portion may be greater than the first thickness of the first portion.

The first portion may be disposed on a portion of the connection wire and may be connected to the third portion.

At least a portion of the connection wire may be disposed in the non-active area and connected to some of the plurality of signal wires passing through the active area, and wherein the plurality of dummy wiring patterns may be disposed only in the active area.

A plurality of non-active fan-out wirings may be disposed in the non-active area between the first data conductive layer and the substrate.

Some of the plurality of non-active fan-out wires may be directly connected to the plurality of signal wires, and others of the plurality of non-active fan-out wires may be connected to the plurality of signal wires through the connection wire.

According to another exemplary embodiment of the present disclosure, a display device includes an active area in which a plurality of pixels is disposed and arranged in a matrix, and a non-active area disposed on a side of the active area in a first direction and including a pad region; a plurality of non-active fan-out wires disposed in the non-active area and connected to the pad region; a plurality of signal wires extending in the first direction to cross the active area and connected to the plurality of pixels; a plurality of connection wires that at least partially passes through the active area and connects some of the plurality of non-active fan-out wires with some of the plurality of signal wires; and a plurality of dummy wiring patterns disposed in the active area to cross some of the connection wires, wherein the plurality of connection wires and the plurality of dummy wiring patterns are formed of a conductive layer disposed on a same layer, and wherein the display device further includes a plurality of disconnections at which the plurality of dummy wiring patterns are separated and a plurality of dummy grooves formed above the plurality of connection wires and spaced apart from one another by a same spacing as the plurality of disconnections.

The plurality of connection wires may include a first extension portion and a second extension portion extending in the first direction, and a third extension portion connected to the first extension portion and the second extension portion and extending in a second direction intersecting the first direction.

The plurality of dummy wiring patterns may include first dummy wiring patterns extending in the first direction and crossing the third extension portion of the plurality of connection wires, and second dummy wiring patterns extending in the second direction and crossing the first extension portion or the second extension portion of the plurality of connection wires.

The plurality of disconnections may include first disconnections formed between the first dummy wiring patterns that are spaced apart from one another in the first direction, and wherein the plurality of dummy grooves may include first dummy grooves disposed above the plurality of connection wires and lie on a same line as the first disconnections.

Each of the plurality of pixels may include an emission area and a non-emission area surrounding the emission area, and at least a portion of the plurality of connection wires and the plurality of dummy wiring patterns may overlap the emission area.

At least some of the plurality of disconnections and the plurality of dummy grooves may overlap the emission area.

The plurality of dummy wiring patterns may further include third dummy wiring patterns disposed in the active area and extending in the second direction to the first dummy wiring patterns and the plurality of signal wires, and the third dummy wiring patterns may do not cross the first extension portion and the second extension portion.

The plurality of disconnections may include second disconnections formed between the second dummy wiring patterns spaced apart from one another in the second direction, and wherein the plurality of dummy grooves may include second dummy grooves disposed above the third dummy wiring patterns and lie on a same line as the second disconnections.

At least some of the second dummy grooves may be further disposed on the third extension portion.

The active area may be divided into an inner active area in which the plurality of non-active fan-out wires overlap in the first direction, and an outer active area in which the plurality of non-active fan-out wires may do not overlap, and the plurality of connection wires may pass through the inner active area to be disposed in the outer active area.

The first extension portion of the plurality of connection wires may be disposed in the inner active area, the second extension portion of the plurality of connection wires may be disposed in the outer active area, and the third extension portion may be disposed from the inner active area to the outer active area.

The plurality of signal wires may be formed of a conductive layer disposed below the plurality of connection wires and the plurality of dummy wiring patterns.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
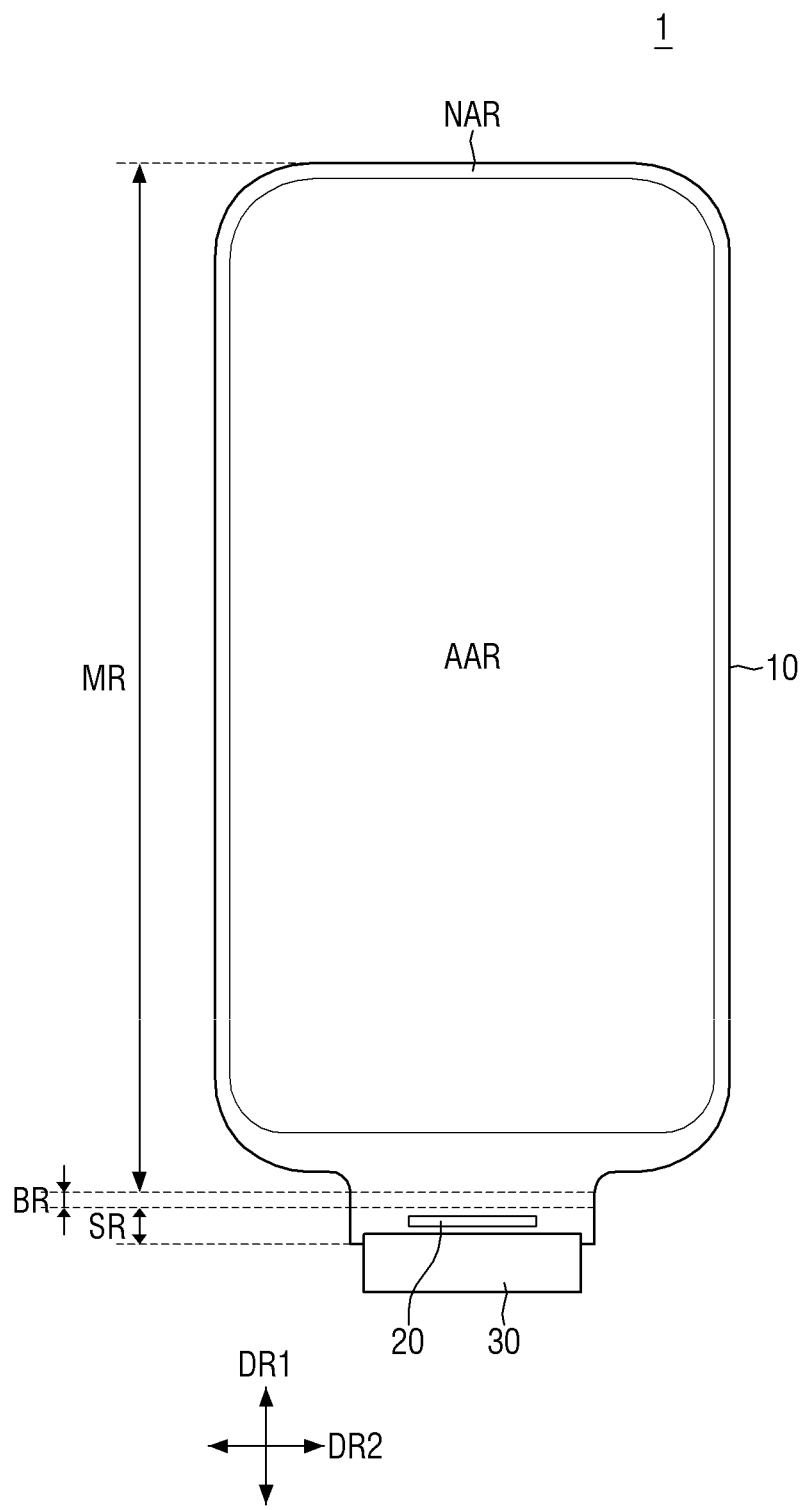
FIG. 1 is a plan view of a display device according to an exemplary embodiment of the present disclosure.

The present disclosure will now be described more fully hereinafter with reference to the accompanying drawings, in which exemplary embodiments of the present disclosure are shown. The present disclosure may, however, be embodied in different forms and configurations and should not be construed as limited to the embodiments set forth herein. Rather, these embodiments are provided so that the present disclosure will be thorough and complete, and will filly convey the scope of the present disclosure to those skilled in the art.

It will also be understood that a layer is described as being "on" another layer or substrate, it can be directly on the other layer or substrate, or one or more intervening layers may also be present therebetween. The same reference numerals indicate the same components throughout the present disclosure.

It will be understood that, although the terms "first," "second," etc. may be used herein to describe various elements, these elements should not be limited by these terms. These terms are used to distinguish one element from another element. For instance, a first element could be termed a second element without departing from the teachings of the present disclosure. Similarly, the second element could also be termed the first element.

Hereinafter, exemplary embodiments of the present disclosure will be described with reference to the accompanying drawings.

Figure 2:
FIG. 2 is a side view of the display device of FIG. 1.

FIG. 1 is a plan view of a display device 1 according to an exemplary embodiment of the present disclosure. FIG. 1 shows a shape of the display device 1 when viewed from the top before it is bent. In the drawings, a first direction DR1 denotes the vertical direction, and a second direction DR2 denotes the horizontal direction when viewed from the top. FIG. 2 show a side view of the display device 1 of FIG. 1 when it is bent in a thickness direction.

Referring to FIGS. 1 and 2, the display device 1 may display moving images (e.g., video) or still images. The display device 1 may be used as a display screen of a portable electronic device such as a mobile phone, a smart phone, a tablet personal computer (PC), a smart watch, a watch phone, a mobile communications terminal, a notebook PC, an electronic book, a portable multimedia player (PMP), a navigation device, and a ultra-mobile PC (UMPC), as well as a display screen of various products and devices such as a television, a picture frame, a monitor, a billboard, and the Internet of Things.

The display device 1 may include a display panel 10. The display panel 10 may include a flexible substrate made of a flexible polymer material such as polyimide. The display panel 10 may be curved, bent, folded, or rolled.

The display panel 10 may include an active area AAR where images are displayed, and a non-active area NAR where no image is displayed. The display panel 10 may be divided into the active area AAR and the non-active area NAR when viewed from the top. The non-active area NAR may surround the active area AAR at least partially or entirely when viewed from the top.

Figure 3:
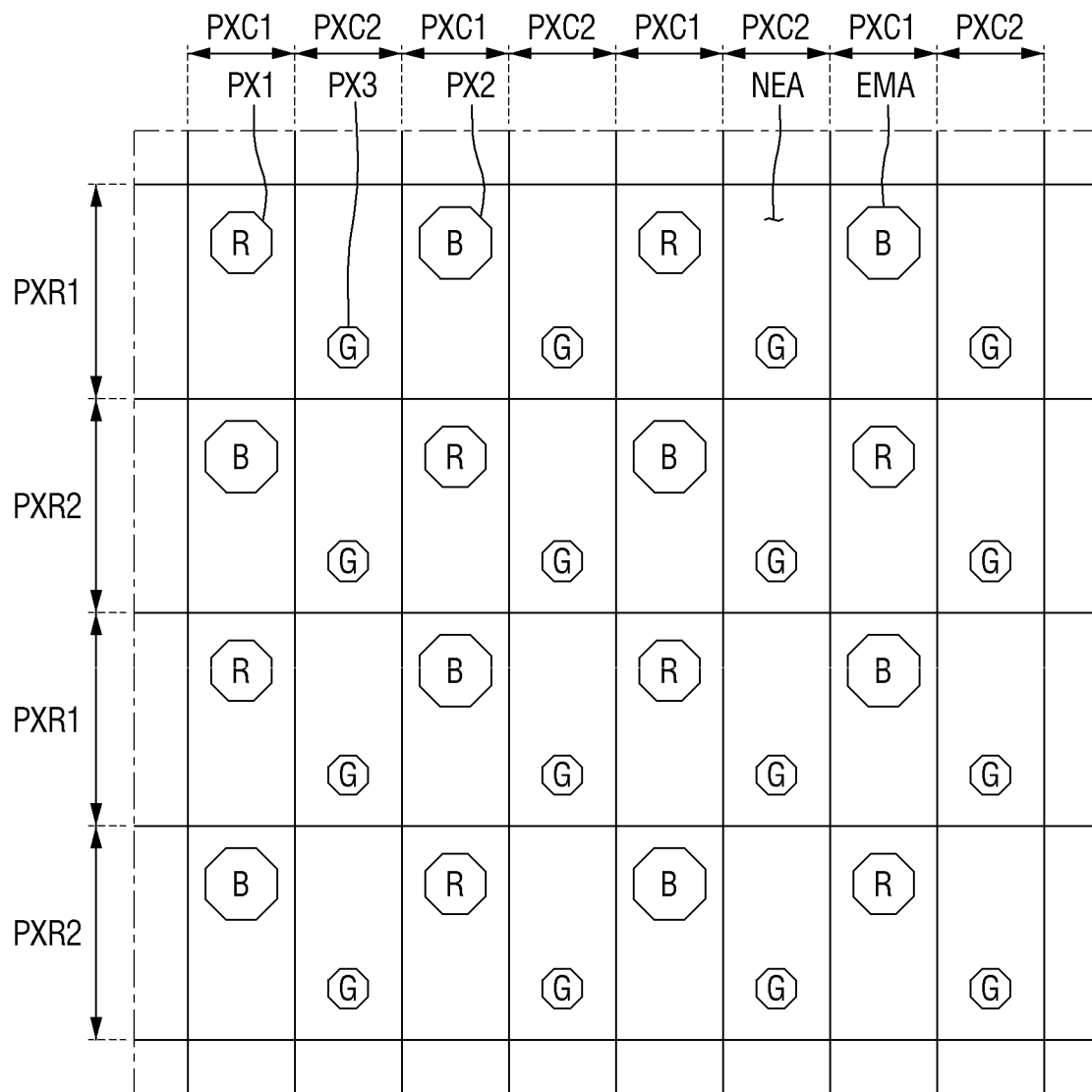
FIG. 3 is a view showing a layout of pixels of a display device according to an exemplary embodiment of the present disclosure.

The active area AAR may include a plurality of pixels PX (e.g., PX1, PX2 and PX3 in FIG. 3). The pixels PX may be arranged in a matrix. Each of the pixels PX may include an emissive layer and a circuit layer for controlling an amount of light emitted from the emissive layer. The circuit layer may include wires, electrodes, and at least one transistor. The emissive layer may include an organic light-emitting material. The emissive layer may be sealed by an encapsulation layer. An exemplary configuration of the pixels PX will be described in detail later.

The display panel 10 may include a main region MR and a bending region BR that is connected to one side of the main region MR in the first direction DR1. The display panel 10 may further include a sub-region SR that is connected to the bending region BR in the first direction DR1 and overlaps the main region MR when bent in the thickness direction.

The main region MR may include the active area AAR. The non-active area NAR may be located at an edge portion of the active area AAR of the main region MR.

The main region MR may have a shape similar to the outer shape of the display device 1 when viewed from the top. The main region MR may have a flat surface in one plane. It is, however, to be understood that the present disclosure is not limited thereto. At least one of the edges of the main region MR except for the edge (or side) that is connected to the bending region BR may be bent to form a curved surface or may be bent at a right angle.

When at least one of the edges of the main region MR except for the edge (or side) that is connected to the bending region BR is curved or bent, the active area AAR may be disposed at the edge. It is, however, to be understood that the present disclosure is not limited thereto. The non-active area NAR that does not display image may be disposed on the curved or bent edge, or the active area AAR and the non-active area NAR may be disposed together.

The non-active area NAR of the main region MR may extend from the outer border of the active area AAR to the edge of the display panel 10. Signal wires for applying signals to the active area AAR or driving circuits of the display panel 10 may be disposed in the non-active area NAR of the main region MR.

The bending region BR may be connected to a shorter side of the main region MR. The width of the bending region BR (in the second direction DR2) may be less than the width (the width of the shorter side) of the main region MR. The portion where the main region MR connects to the bending region BR may be cut in an L-shape to reduce the bezel width.

In the bending region BR, the display panel 10 may be bent with a curvature toward the opposite side of the display surface. As the display panel 10 is bent at the bending region BR, the surface of the display panel 10 may be reversed. Referring to FIG. 2, the surface of the display panel 10 facing upward in the main region MR may be bent such that it faces downward in the sub-region SR.

The sub-region SR extends from the bending region BR in a direction parallel to the main region MR after the display device 1 is bent. The sub-region SR may overlap the main region MR in the thickness direction of the display panel 10. The sub-region SR may overlap the non-active area NAR at the edge of the main region MR and may also overlap the active area AAR of the main region MR. The width of the sub-region SR may be, but is not limited to being, equal to the width of the bending region BR.

A pad region PDR (see FIG. 6) may be disposed on the sub-region SR of the display panel 10. An external device may be mounted (or attached) to the pad region PDR. Examples of the external device include a driving chip 20, a driving board 30 in the form of a flexible printed circuit board or a rigid printed circuit board, and wire connection films, connectors, etc. More than one external devices may be mounted on the sub-region SR. For example, as shown in FIGS. 1 and 2, the driving chip 20 may be disposed in the sub-region SR of the display panel 10, and the driving board 30 may be attached to an end of the sub-region SR. In this case, the display device 10 may include a first pad region connected to the driving chip 20 and a second pad region connected to the driving board 30. According to another exemplary embodiment, the driving chip 20 may be mounted on a film, and the film may be attached to the sub-region SR of the display panel 10.

The driving chip 20 may be mounted on the surface of the display panel 10. After the display device 10 is bent at the bending region BR in the thickness direction as described above, the upper surface of the driving chip 20 0 may face downward.

The driving chip 20 may be attached on the display panel 10 by an anisotropic conductive film or by ultrasonic bonding. The width of the driving chip 20 may be less than the width of the display panel 10 in the second direction DR2. The driving chip 20 may be disposed at the center of the sub-region SR in the second direction DR2, and the left and right edges of the driving chip 20 may be spaced apart from the left and right edges of the sub-region SR, respectively.

The driving chip 20 may include an integrated circuit (IC) for driving the display panel 10. In an exemplary embodiment, the integrated circuit may be, but is not limited to, a data driving integrated circuit that generates and provides data signals. The driving chip 20 may be connected to wire pads WR_PD (see FIG. 6) that are disposed in the pad region PDR of the display panel 10 to provide a data signal toward the wire pads WR_PD. The wires WR (see FIG. 6) that are connected to the wire pads extend toward the pixels PX to apply the data signal, etc. to each of the pixels PX.

FIG. 3 is a view showing a layout of pixels of a display device according to an exemplary embodiment of the present disclosure.

Referring to FIG. 3, the pixels PX may include first color pixels PX1, second color pixels PX2, and third color pixels PX3. According to an exemplary embodiment of the present disclosure, the first color pixels PX1 may be red pixels, the second color pixels PX2 may be blue pixels, and the third color pixels PX3 may be green pixels. The pixels PX may be arranged sequentially and repeatedly to form a matrix.

Each of the pixels PX may include an emission area EMA and a non-emission area NEA that surrounds the emission area EMA. The emission areas EMA of the pixels PX1, PX2 and PX3 may have different sizes. For example, the emission area EMA of each of the second color pixels PX2 may be larger than the emission area EMA of each of first color pixels PX1, and the emission area EMA of each of the third color pixels PX3 may be smaller than the emission area EMA of each of the first color pixels PX1. The shape of the emission area EMA of each of the pixels PX may be, but is not limited to, generally an octagonal shape. In other embodiments, the emission area EMA may have a hexagonal shape, a circular shape, a diamond shape, a polygonal shape, or a polygonal shape with rounded corners, etc.

In some of the pixel columns PXC (hereinafter, first pixel columns PXC1) the first color pixels PX1 and the second color pixels PX2 are alternately arranged in the first direction DR1 (a column direction). In some other pixel columns PXC (hereinafter, second pixel columns PXC2), the third color pixels PX3 are repeatedly arranged. The first pixel columns PXC1 and the second pixel columns PXC2 may be alternately arranged in the second direction DR2 (a row direction). For example, the odd-numbered pixel columns PXC may be the first pixel columns PXC1, and the even-numbered pixel columns PXC may be the second pixel columns PXC2.

The emission areas EMA of one pixel column PXC may be generally aligned with one another in the first direction DR1. The emission areas EMA of one pixel column PXC and the emission areas EMA of a neighboring pixel column PXC may be staggered. For example, first color pixels PX1 and second color pixels PX2 in a pixel row PXR (e.g., PXR1, PXR2) may be arranged in the second direction DR2 between the adjacent third color pixels PX3 in the same pixel row PXR. Similarly, third color pixels PX3 in a pixel row PXR may be arranged in the second direction DR2 between adjacent first color pixels PX1 and second column pixels PX2 in the same pixel row PXR.

In each of the pixel rows PXR, the first color pixels PX1 and the second color pixels PX2 may be alternately arranged with the third color pixels PX3 interposed therebetween. For example, in the first pixel row PXR1, a first color pixel PX1, a third color pixel PX3, a second color pixel PX2, and a third color pixel PX3 are repeatedly arranged. In the second pixel row PXR2, a second color pixel PX2, a third color pixel PX3, a first color pixel PX1, and a third color pixel PX3 are repeatedly arranged. The first pixel rows PXR1 and the second pixel rows PXR2 may be alternately arranged in the first direction DR1 (the column direction). For example, the odd-numbered pixel rows PXR may be the first pixel rows PXR1, and the even-numbered pixel rows PXR may be the second pixel rows PXR2. In a pixel row PXR, the emission area EMA of the first color pixel PX1 and the emission area EMA of the second color pixel PX2 may be closer to a side adjacent to a neighboring pixel row PXR in the first direction DR1 than the emission area EMA of the third color pixel PX3. For example, the emission areas EMA of the pixels PX in a pixel row PXR may be arranged in a zigzag pattern in the second direction DR2.

The pixels PX belonging to the same pixel column PXC may receive a data signal from a common data line, and the pixels PX belonging to the same pixel row PXR may receive a gate signal from a common scan line. Each of the pixels PX may be driven by a pixel circuit. The pixel circuit may include a plurality of transistors and at least one capacitor.

Figure 4:
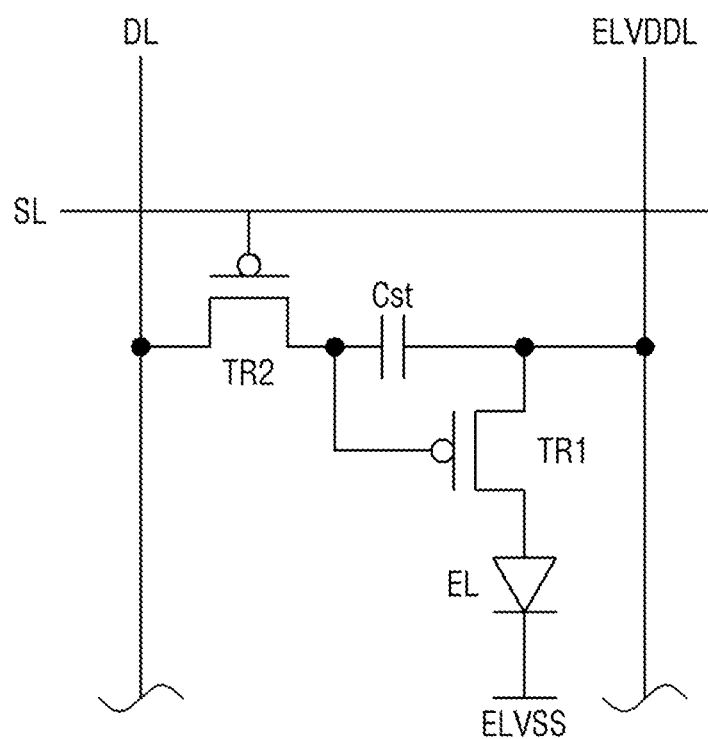
FIG. 4 is a circuit diagram of one pixel of a display device according to an exemplary embodiment of the present disclosure.

FIG. 4 is a circuit diagram of one pixel of a display device according to an exemplary embodiment of the present disclosure.

Referring to FIG. 4, the pixel circuit may include a first transistor TR1, a second transistor TR2, a capacitor Cst, and an organic light-emitting diode EL. A scan line SL, a data line DL, and a first supply voltage wire ELVDDL are connected to the pixel circuit.

The first transistor TR1 may be a driving transistor, and the second transistor TR2 may be a switching transistor. Although both of the first transistor TR1 and the second transistor TR2 are illustrated as P-type metal-oxide-semiconductor (PMOS) transistors in FIG. 4, the first transistor TR1 and/or the second transistor TR2 may be N-type metal-oxide-semiconductor (NMOS) transistors in other embodiments without deviating from the scope of the present disclosure.

The first electrode (source electrode) of the first transistor TR1 is connected to the first supply voltage wire ELVDDL, and the second electrode (drain electrode) thereof is connected to a pixel electrode (or an anode electrode) of the organic light-emitting emitting diode EL. The first electrode (source electrode) of the second transistor TR2 is connected to the data line DL, and the second electrode (drain electrode) thereof is connected to a gate electrode of the first transistor TR1. The capacitor Cst is connected between the gate electrode and the first electrode of the first transistor TR1. A common electrode (or a cathode electrode) of the organic light-emitting diode EL receives a second supply voltage ELVSS. The second supply voltage ELVSS may have a voltage level lower than that of the first supply voltage ELVDD that is applied from the first supply voltage wire ELVDDL.

The second transistor TR2 may output a data signal applied to the data line DL in response to a scan signal applied to the scan line SL. The capacitor Cst is charged with a voltage corresponding to the data signal received through the second transistor TR2. The first transistor TR1 may control an amount of driving current flowing through the organic light-emitting diode OLED in response to the amount of charges stored in the capacitor Cst.

The equivalent circuit of FIG. 4 is merely an example, and the pixel circuit may include more than two transistors (e.g., seven transistors) and two or more capacitors.

Figure 5:
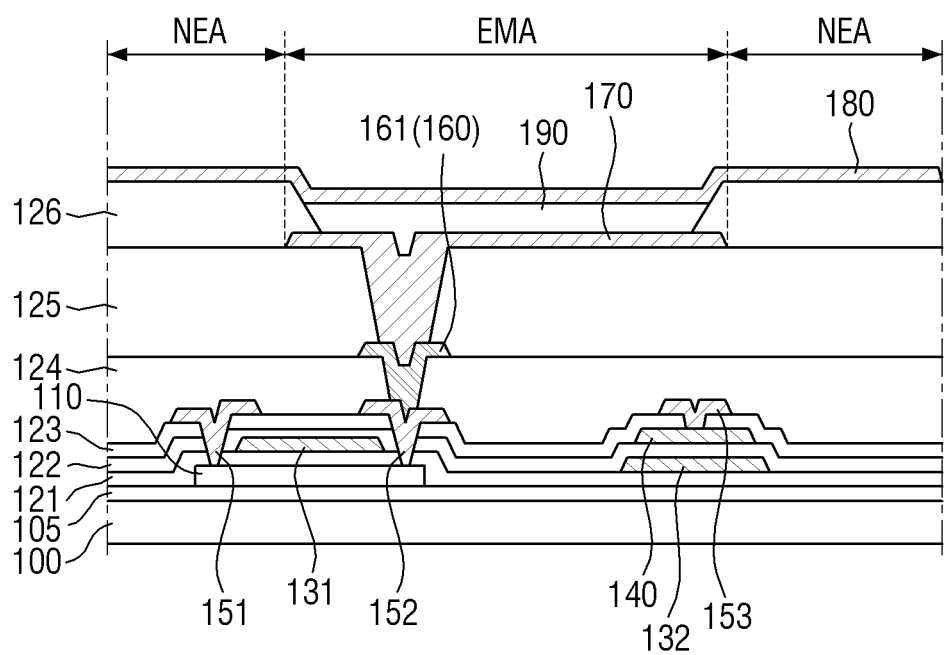
FIG. 5 is a cross-sectional view of one pixel of a display device according to an exemplary embodiment of the present disclosure.

FIG. 5 is a cross-sectional view of one pixel of a display device according to an exemplary embodiment of the present disclosure. In FIG. 5, one of the transistors (e.g., the first transistor TR1) among the two transistors TR1 and TR2 of FIG. 4 is shown in the form of a thin film transistor for the convenience of illustration.

The structure of a pixel PX (e.g., PX1, PX2 and PX3 in FIG. 3) will be described in detail with respect to FIG. 5. The display panel 10 may include a substrate 100, a buffer layer 105, a semiconductor layer 110, a first insulating layer 121, a first gate conductive layer 130, a second insulating layer 122, a second gate conductive layer 140, a third insulating layer 123, a first data conductive layer 150, a fourth insulating layer 124, a second conductive layer 160, a fifth insulating layer 125, a pixel electrode 170, a bank 126 including an opening for exposing the pixel electrode 170, an organic layer 190 disposed within the opening of the bank 126, and a common electrode 180 disposed on the organic layer 190 and the bank 126. Each of the above-listed layers may include a single layer, or a stack of layers including a plurality of layers. Other layers may be further disposed between adjacent ones of the above-listed layers.

The substrate 100 supports the layers disposed thereon. The substrate 100 may be made of an insulating material such as a polymer resin. Examples of the polymer material may include, but are not limited to, polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or any combination thereof. The substrate 100 may be a flexible substrate that can be bent, folded, or rolled.

The buffer layer 105 is disposed on the substrate 100. The buffer layer 105 may prevent diffusion of impurity ions and permeation of moisture and/or air while providing a flat surface. The buffer layer 105 may include silicon nitride, silicon oxide, silicon oxynitride, or the like. The buffer layer 105 may be eliminated depending on the type of the substrate 100, process conditions, etc.

The semiconductor layer 110 is disposed on the buffer layer 105. The semiconductor layer 110 forms a channel of a thin-film transistor (e.g., the first transistor TR1) of the pixel PX. The semiconductor layer 110 may include polycrystalwire silicon. It is, however, to be understood that the present disclosure is not limited thereto. The semiconductor layer 110 may include monocrystalwire silicon, low-temperature polycrystalwire silicon, amorphous silicon, or an oxide semiconductor. Examples of the oxide semiconductor may include, but are not limited to, a binary compound (ABx), a ternary compound (ABxCy) and a quaternary compound (ABxCyDz) containing one or more of indium (In), zinc (Zn), gallium (Ga), tin (Sn), titanium (Ti), aluminum (Al), hafnium (Hf), zirconium (Zr), magnesium (Mg), etc.

The first insulating layer 121 may serve as a gate insulating layer. The first insulating layer 121 may include a silicon compound, a metal oxide, etc. For example, the first insulating layer 121 may include silicon oxide, silicon nitride, silicon oxynitride, aluminum oxide, tantalum oxide, hafnium oxide, zirconium oxide, titanium oxide, etc. They may be used alone or in any combination. The first insulating layer 121 may include a single layer or multiple layers of different materials stacked on one another.

The first insulating layer 121 is disposed on the semiconductor layer 110. The first insulating layer 121 may be disposed generally on the entire surface of the substrate 100.

The first gate conductive layer 130 is disposed on the first insulating layer 121. The first gate conductive layer 130 may include a gate electrode 131 of the thin-film transistor of the pixel PX and the scan line SL connected thereto, a first electrode 132 of a storage capacitor (e.g., the capacitor Cst of FIG. 4). The first gate conductive layer 130 may further include a first non-active fan-out wire NFW_1 (see FIG. 8) arranged in the non-active area NAR.

The first gate conductive layer 130 may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first gate conductive layer 130 may include a single layer or multiple layers.

The second insulating layer 122 may be disposed on the first gate conductive layer 130. The second insulating layer 122 may serve as an interlayer dielectric layer or a gate insulating layer. The second insulating layer 122 may include an inorganic insulating material such as silicon oxide, silicon nitride, silicon oxynitride, hafnium oxide, aluminum oxide, titanium oxide, tantalum oxide, and zinc oxide.

The second gate conductive layer 140 is disposed on the second insulating layer 122. The second gate conductive layer 140 may include a second electrode of the storage capacitor. The second gate conductive layer 140 may further include a second non-active fan-out wire NFW_2 (see FIG. 8) arranged in the non-active area NAR. The second gate conductive layer 140 may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 140 may include, but is not limited to, the same material as the first gate conductive layer 130. The second gate conductive layer 140 may include a single layer or multiple layers.

The third insulating layer 123 is disposed on the second gate conductive layer 140. The third insulating layer 123 may serve as an interlayer dielectric layer. The third insulating layer 123 may include an inorganic insulating materials such as silicon oxide, silicon nitride, silicon oxynitride, hafnium oxide, aluminum oxide, titanium oxide, tantalum oxide, and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin, and benzocyclobutene (BCB). The third insulating layer 123 may include a single layer or multiple layers of different materials stacked on one another.

The first data conductive layer 150 is disposed on the third insulating layer 123. The first data conductive layer 150 may include a first source/drain conductive layer. For example, the first data conductive layer 150 may include a first electrode 151 and a second electrode 152 of the thin film transistor of the pixel PX. The first data conductive layer 150 may further include signal wires SW1 and SW2 (see FIG. 8). The first electrode 151 and the second electrode 152 of the thin film transistor may be electrically connected to the source region and the drain region of the semiconductor layer 110, respectively, through contact holes passing through the third insulating layer 123, the second insulating layer 122, and the first insulating layer 121. The first data conductive layer 150 may further include a first supply voltage electrode 153 of the pixel PX.

The first data conductive layer 150 may include one or more of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first data conductive layer 150 may include a single layer or multiple layers. For example, the first data conductive layer 150 may have a stack structure of Ti/Al/Ti, Mo/Al/Mo, Mo/AlGe/Mo, or Ti/Cu.

The fourth insulating layer 124 is disposed on the first data conductive layer 150. The fourth insulating layer 124 covers the first data conductive layer 150. The fourth insulating layer 124 may serve as an interlayer dielectric layer or a via layer. The fourth insulating layer 124 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The second data conductive layer 160 is disposed on the fourth insulating layer 124. The second data conductive layer 160 may include a second source/drain conductive layer. For example, the second data conductive layer 160 may include a connection electrode 161 of the pixel PX. The second data conductive layer 160 may further include a connection wire CNW (see FIG. 8). The connection electrode 161 may be electrically connected to the second electrode 152 of the thin-film transistor of the pixel PX through a contact hole passing through the fourth insulating layer 124.

The second data conductive layer 160 may include one or more of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second data conductive layer 160 may include a single layer or multiple layers. The second data conductive layer 160 may include, but is not limited to, the same material as the first data conductive layer 150.

The fifth insulating layer 125 is disposed on the second data conductive layer 160. The fifth insulating layer 125 covers the second data conductive layer 160. The fifth insulating layer 125 may serve as a via layer. The fifth insulating layer 125 may include the same material as the fourth insulating layer 124 or may include one or more materials listed above as the examples of materials of the fourth insulating layer 124.

The pixel electrode 170 is disposed on the fifth insulating layer 125. The pixel electrode 170 may correspond to an anode electrode of a light-emitting element (e.g., the organic light-emitting diode EL of FIG. 4). The pixel electrode 170 may be electrically connected to the connection electrode 161 included in the second data conductive layer 160 through a contact hole penetrating through the fifth insulating layer 125 and may be connected to the second electrode 152 of the thin-film transistor through the connection electrode 161. The pixel electrode 170 may at least partially overlap the emission area EMA of the pixel PX.

The pixel electrode 170 may have, but is not limited to, a stack structure of a layer having a high work function such as indium-tin-oxide (ITO), indium-zinc-oxide (IZO), zinc oxide (ZnO), and indium oxide ($In_2O_3$), and a reflective material layer such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any mixture thereof. The layer having the high work function may be disposed above the reflective material layer so that it is disposed closer to the organic layer 190. The pixel electrode 170 may have, but is not limited to, a multilayer structure of ITO/Mg, ITO/MgF, ITO/Ag, and ITO/Ag/ITO.

The bank 126 may be disposed on the fifth insulating layer 125 and the pixel electrode 170. The bank 126 may at least partially overlap the non-emission area NEA of the pixel PX. The bank 126 may include an opening exposing at least a portion of the pixel electrode 170 in the emission area EMA. Herein, the bank 126 may be also referred to as a pixel defining layer. The bank 126 may include an inorganic insulating materials such as silicon oxide, silicon nitride, silicon oxynitride, hafnium oxide, aluminum oxide, titanium oxide, tantalum oxide, and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin, and benzocyclobutene (BCB). The bank 126 may include a single layer or multiple layers of different materials stacked on one another.

The emissive layer of the pixel PX is disposed in the opening of the bank 126. The emissive layer may include an inorganic material or an organic material. In an exemplary embodiment, the emissive layer may include the organic layer 190. The organic layer 190 may include an organic emissive layer, a hole injecting/transporting layer, and an electron injecting/transporting layer. The organic layer 190 may overlap the emission area EMA.

The common electrode 180 is disposed on the organic layer 190 and the bank 126. The common electrode 180 may correspond to a cathode electrode of the light-emitting element. The common electrode 180 may also be disposed in the non-emission area NEA as well as the emission area EMA of the pixel PX. For example, the common electrode 180 may be disposed on the entire surface of each of the pixels PX. The common electrode 180 may include a layer having a small work function such as Li, Ca, LiF/Ca, LiF/Al, Al, Mg, Ag, Pt, Pd, Ni, Au, Nd, Ir, Cr, BaF, and Ba, or any compound or mixture thereof (e.g., a mixture of Ag and Mg). The common electrode 180 may further include a transparent metal oxide layer disposed on the layer having the small work function.

Although not shown in the drawings, an encapsulation layer may be disposed on the common electrode 180. The encapsulation layer may include an inorganic layer. According to an exemplary embodiment of the present disclosure, the encapsulation layer may include a first inorganic layer, an organic layer disposed on the first inorganic layer, and a second inorganic layer disposed on the organic layer.

Figure 6:
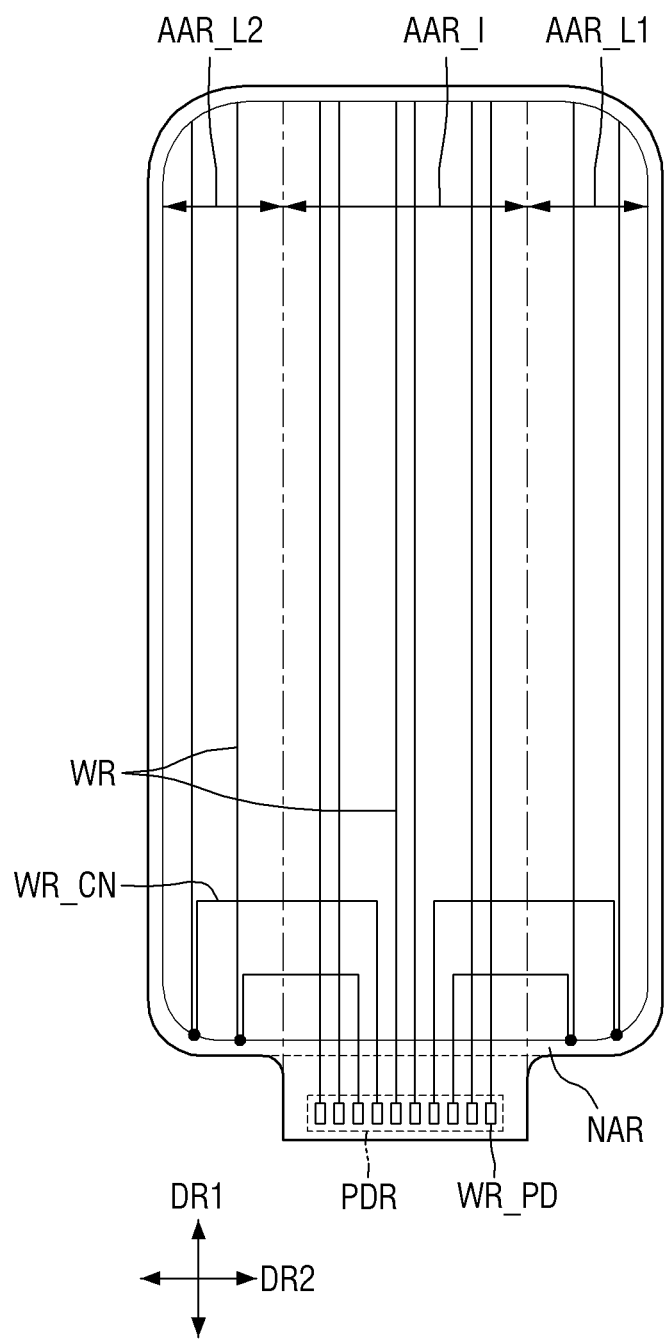
FIG. 6 is a view showing a layout of some wires in a display device according to an exemplary embodiment of the present disclosure.

FIG. 6 is a view showing a layout of some wires in a display device according to an exemplary embodiment of the present disclosure.

Referring to FIG. 6, the width of a row including the wire pads WR_ arranged in the pad region PDR in the second direction DR2 is smaller than the width of the active area AAR in the second direction DR2. To cover the width of the active area AAR, the wires WR may expand gradually outwardly from the wire pads WR_PD in a direction toward the active area AAR. For example, the wires WR are arranged in the non-active area NAR near the active area AAR. However, as the bezel of the display device 1 is reduced, the space where the wires WR can be arranged and expand may be reduced. The space may become even more insufficient if the display device 1 has portions cut in an L-shape or if other wires WR are disposed at the corners. As a result, the arrangement of the wires WR extending from the pad region PDR in the second direction DR2 may have a smaller width in the non-active area NAR adjacent to the active area AAR than in the active area AAR.

The active area AAR may be divided into an inner active area AAR_I and outer active areas AAR_L including a first outer active area AAR_L1 and a second outer active area AAR_L2 based on a relative relationship with an arrangement area of the wires WR extending from the pad region PDR in the non-active area NAR adjacent thereto. In the inner active area AAR_I, the wires WR extending from the pad region PDR of the non-active area NAR adjacent to the active area AAR overlap in the first direction DR1 toward the active area AAR. In the outer active areas AAR_L, the wires WR extending from the pad region PDR of the non-active area NAR adjacent to the active area AAR do not overlap in the first direction DR1 toward the active area AAR. Although FIG. 6 shows that the inner active area AAR_I is located at the center of the active area AAR, the first outer active area AAR_L1 is located on one side of the inner active area AAR_I in the second direction DR2, and the second outer active area AAR_L2 is located on the other side of the inner active area AAR_I in the second direction DR2, the present disclosure is not limited thereto. The number and location of the inner active area AAR_I and the outer active areas AAR_L may vary depending on a position and configuration of the row of the wire pads WR_PD in the pad region PDR.

In the inner active area AAR_I, the wires WR extend from the non-active area NAR adjacent to the inner active area AAR_I (i.e., the inner non-active area NAR) in the first direction DR1, thereby applying signals to the connected pixels PX. On the other hand, in the outer active area AAR_L, the wires WR are routed from the inner inactive area NAR to an outer side (one side or the other side of the second direction DR2) through routing wires WR_CN, and extend in the first direction DR1, thereby applying signals to the connected pixels PX. The routing wires WR_CN may pass through the inner active area AAR_I to reach the non-active area NAR adjacent to the outer active area AAR_L (i.e., the outer non-active area NAR). Since other wires WR are disposed in the active area AAR through which the routing wires WR_CN pass, the routing wires WR_CN may be disposed in a conductive layer different from the conductive layer in which the other wires WR are arranged in the active area AAR to prevent short-circuit between the wires WR.

Figure 7:
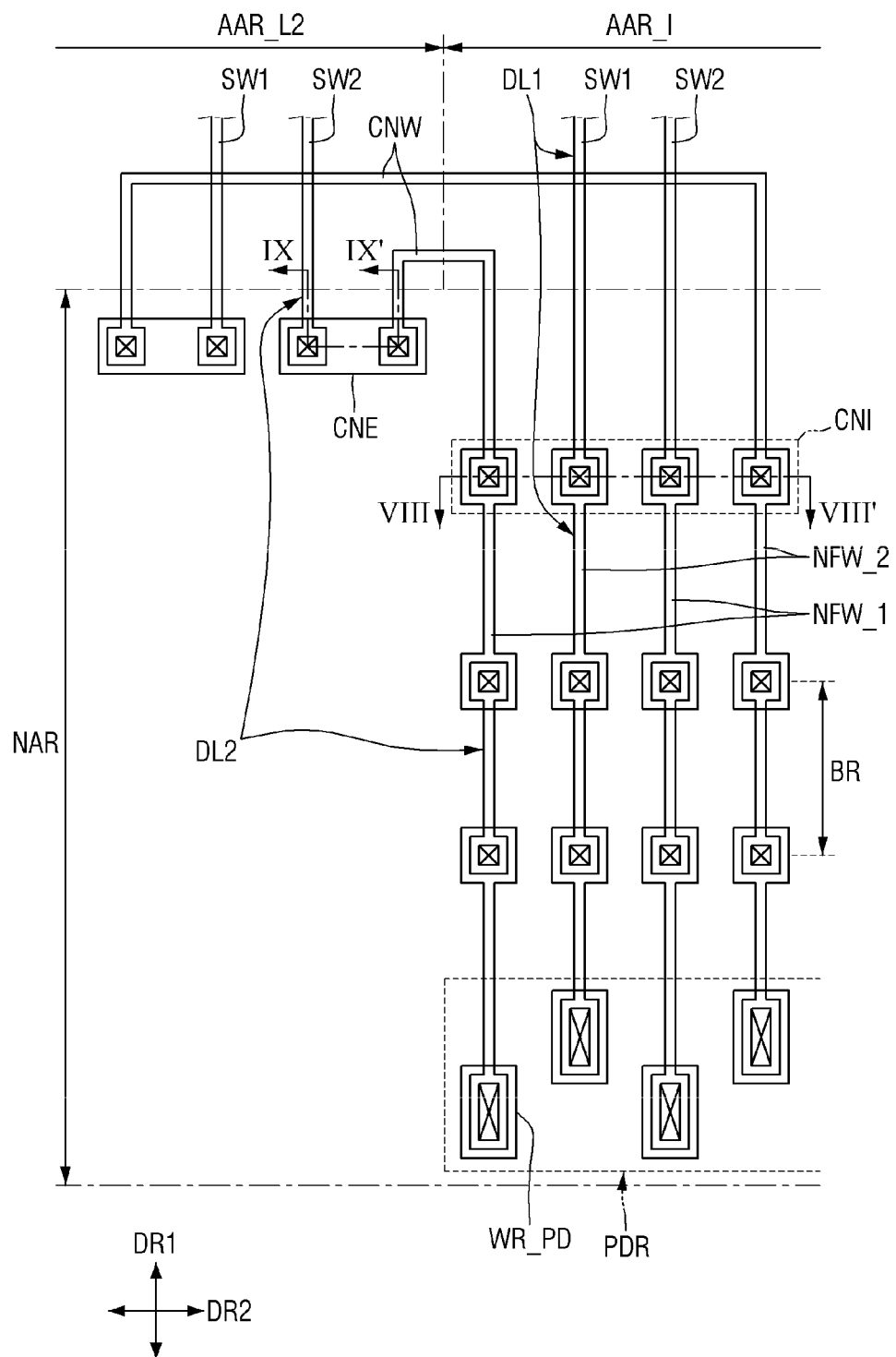
FIG. 7 is a view showing a layout of wires of data lines according to an exemplary embodiment of the present disclosure.
Figure 8:
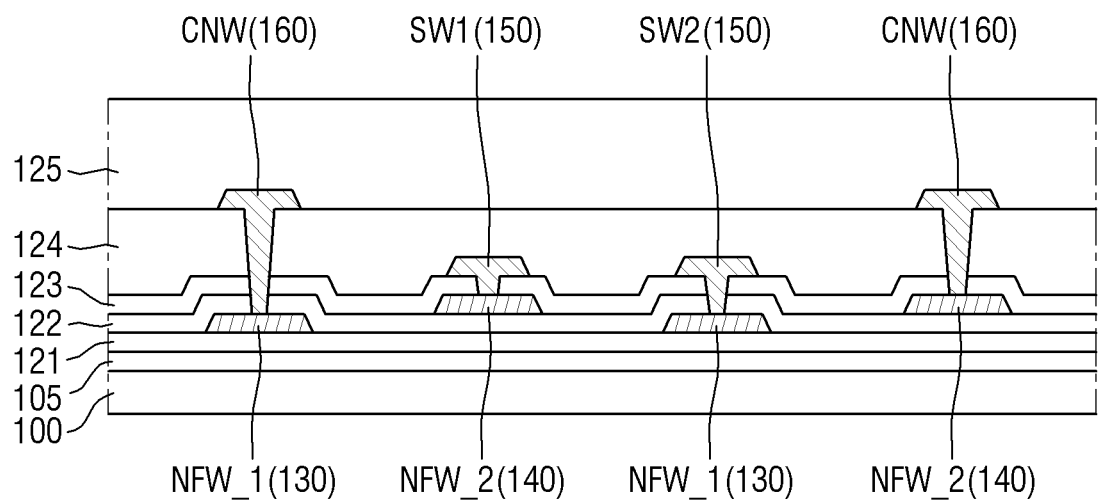
FIG. 8 is a cross-sectional view taken along line VIII-VIII' of FIG. 7.
Figure 9:
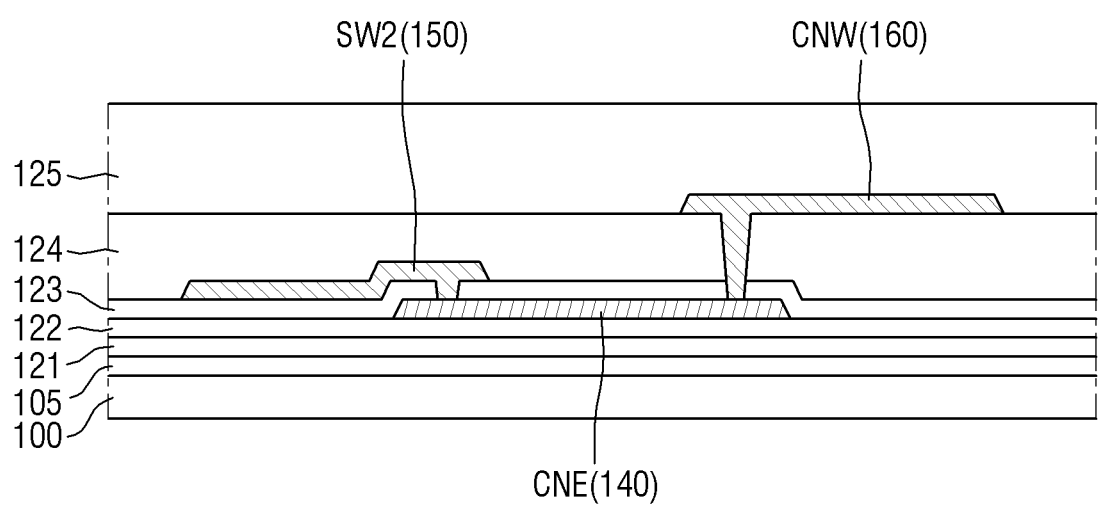
FIG. 9 is a cross-sectional view taken along line IX-IX' of FIG. 7.

FIG. 7 is a view showing a layout of signal wires of data lines according to an exemplary embodiment of the present disclosure. FIG. 8 is a cross-sectional view taken along line VIII-VIII' of FIG. 7. FIG. 9 is a cross-sectional view taken along line IX-IX' of FIG. 7.

Referring to FIGS. 7 to 9, the data lines DL include first data lines DL1 that provide first data signals to pixels PX belonging to the first pixel column PXC1, and second data lines DL2 that provide second data signals to pixels PX belonging to the second pixel column PXC2. The first data lines DL1 and the second data lines DL2 may be connected from the pad region PDR to the pixels PX in the active area AAR. The first data lines DL1 and the second data lines DL2 may be alternately arranged in the second direction DR2 in the active area AAR.

The first data lines DL1 and the second data lines DL2 may be divided into inner data lines and outer data lines. The inner data lines may provide data signals to the pixels PX located in the inner active area AAR_I while the outer data lines may provide data signals to the pixels PX located in the outer active areas AAR_L.

The inner data lines may include non-active fan-out wires NFW_1 and NFW_2 and signal wires SW1 and SW2. The non-active fan-out wires NFW_1 and NFW_2 may be disposed in the inner non-active area NAR, and the signal wires SW1 and SW2 may be disposed to extend from the inner non-active area NAR to the active area AAR.

The first data lines DL1 corresponding to the inner data lines may include the second non-active fan-out wire NFW_2 and the first signal wire SW1. The second data lines DL2 corresponding to the inner data lines may include the first non-active fan-out wire NFW_1 and the second signal wire SW2.

The second non-active fan-out wire NFW_2 and the first signal wire SW1 of the first data lines DL1, and the first non-active fan-out wire NFW_1 and the second signal wire SW2 of the second data lines DL2 may be interconnected with each other at an inner wire contact CNI in the non-active area NAR adjacent to the inner active area AAR_I. At the inner wire contact CNI, the second non-active fan-out wire NFW_2 and the first signal wire SW1 of the first data lines DL1, and the first non-active fan-out wire NFW_1 and the second signal wire SW2 of the second data lines DL2 may be in direct contact with each other.

The outer data lines may further include connection wires CNW that route wires WR_CN (see FIG. 6) in addition to the non-active fan-out wires NFW_1 and NFW_2 and the signal wires SW1 and SW2. The non-active fan-out wires NFW_1 and NFW_2 may be disposed in the inner non-active area NAR, and the signal wires SW1 and SW2 and the connection wires CNW may be disposed to extend from the inner non-active area NAR to the active area AAR.

The first data lines DL1 corresponding to the outer data lines may include the second non-active fan-out wire NFW_2, the connection wire CNW, and the first signal wire SW1. The second data lines DL2 corresponding to the outer data lines may include the first non-active fan-out wire NFW_1, the connection wire CNW, and the second signal wire SW2. The connection wires CNW may correspond to active fan-out wires passing through the active area AAR.

The connection wires CNW and the non-active fan-out wires NFW_1 and NFW_2 of the outer data lines may be interconnected with each other at an inner wire contact CNI in the inner non-active area NAR. At the inner wire contact CNI, the non-active fan-out wires NFW_1 and NFW_2 and the connection wires CNW may be in direct contact with each other. The connection wires CNW and the signal wires SW1 and SW2 may be interconnected at outer wire contacts in the non-active area NAR adjacent to the outer active areas AAR_L. At the outer wire contacts, the connection wires CNW and the signal wires SW1 and SW2 may be connected through contact electrodes CNE. It is, however, to be understood that the present disclosure is not limited thereto. The connection wires CNW and the signal wires SW1 and SW2 may be in direct contact with each other in the outer wire contacts without the contact electrodes CNE. In one embodiment, the connection wires CNW and/or the signal wires SW1 and SW2 in the outer wire contacts may further include a portion conforming to a shape of the contact electrode CNE (e.g., a portion bent in the second direction DR2 from the wire).

The inner data lines include the fan-out wires NFW_1 and NFW_2 and the signal wires SW1 and SW2 that may be directly connected without a connection wire CNW that traverses the active area AAR, and they may be referred to as direct-connected data lines, or direct-type data lines. The outer data lines include the non-active fan-out wires NFW_1 and NFW_2 and the signal wires SW1 and SW2 that are connected through connection wires CNW, and they may be referred to as indirect-connected data lines, or indirect-type data lines.

The non-active fan-out wires NFW_1 and NFW_2, the signal wires SW1 and SW2, and the connection wires CNW may be formed of conductive layers disposed on different layers. According to an exemplary embodiment of the present disclosure, the non-active fan-out wires NFW_1 and NFW_2 may include the first and second gate conductive layers 130 and 140, and the signal wires SW1 and SW2 and the connection wire CNW may include the first and second data conductive layers 150 and 160.

In one embodiment, regardless of whether it is an inner data line or an outer data line, the first non-active fan-out wire NFW_1 belonging to the second data line DL2 may be formed of the first gate conductive layer 130, and the second non-active fan-out wire NFW_2 belonging to the first data line DL1 may be formed of the second gate conductive layer 140. It is, however, to be understood that the present disclosure is not limited thereto. In another embodiment, the first non-active fan-out wire NFW_1 may be formed of the second gate conductive layer 140, and the second non-active fan-out wire NFW_2 may be formed of the first gate conductive layer 130.

In one embodiment, regardless of whether they are an inner data line or an outer data line, the first signal wires SW1 and the second signal wires SW2 may be formed of the first data conductive layer 150, and the connection wires CNW may be formed of the second data conductive layer 160. It is, however, to be understood that the present disclosure is not limited thereto. In another embodiment, the first signal wires SW1 and the second signal wires SW2 both may be formed of the second data conductive layer 160, and the connection wires CNW may be formed of the first data conductive layer 150.

The contact electrode CNE may be formed of a conductive layer that is disposed on a different layer from the connection wire CNW and the signal wires SW1 and SW2. For example, the contact electrode CNE may be formed of the second gate conductive layer 140 as shown in FIG. 9, but in another example, it may be formed of the first gate conductive layer 130.

The non-active fan-out wires NFW_1 and NFW_2 are connected to the wire pads WR_PD via different conductive layers. For example, the non-active fan-out wires NFW_1 and NFW_2 may pass through the bending region BR as the first data conductive layer 150 or the second data conductive layer 160, and may extend using the first gate conductive layer 130 or the second gate conductive layer 140 in the sub-region SR. The wire pads WP_PD may include the first and second gate conductive layers 130 and 140 and the first and second data conductive layers 150 and 160 connected thereto via contact holes. When a wire extends from a conductive layer to another conductive layer, a contact hole may be formed to connect the conductive layers.

Figure 10:
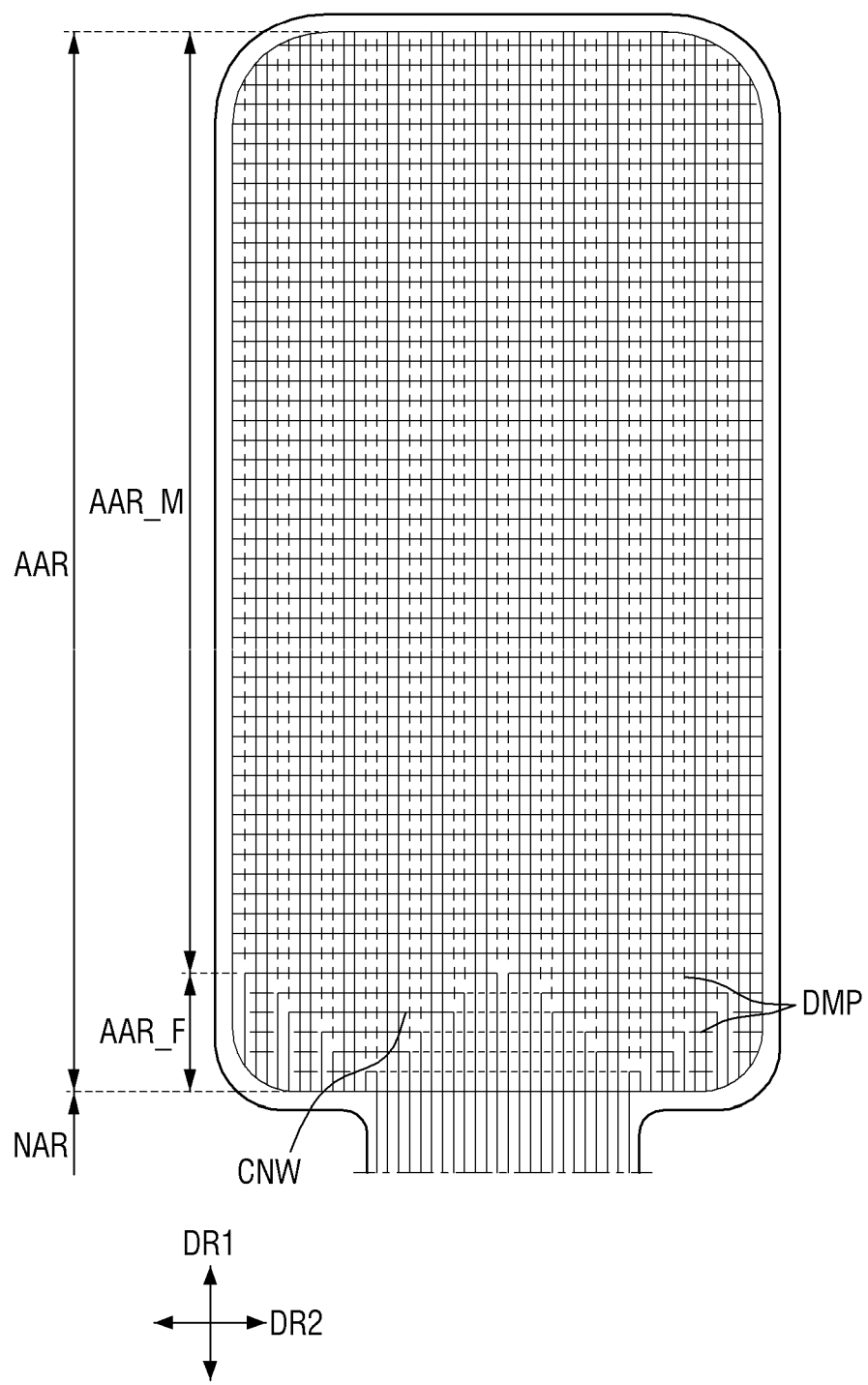
FIG. 10 is a diagram showing a layout of a plurality of wires arranged in an active area of a display device according to an exemplary embodiment of the present disclosure.
Figure 11:
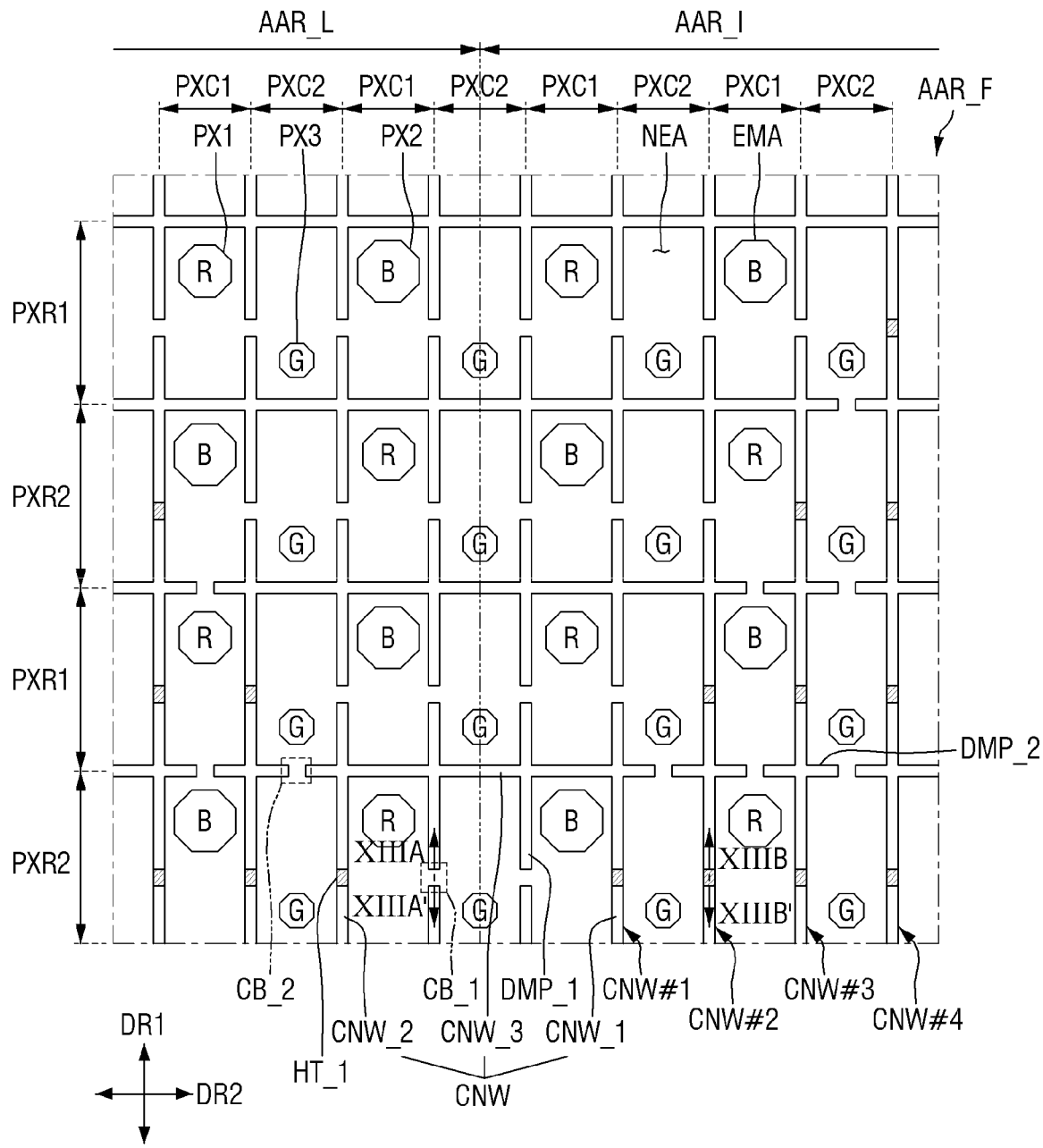
FIG. 11 is a diagram showing a portion of a layout of connection wires and dummy wiring patterns in an active fan-out area of a display device according to an exemplary embodiment of the present disclosure.
Figure 12:
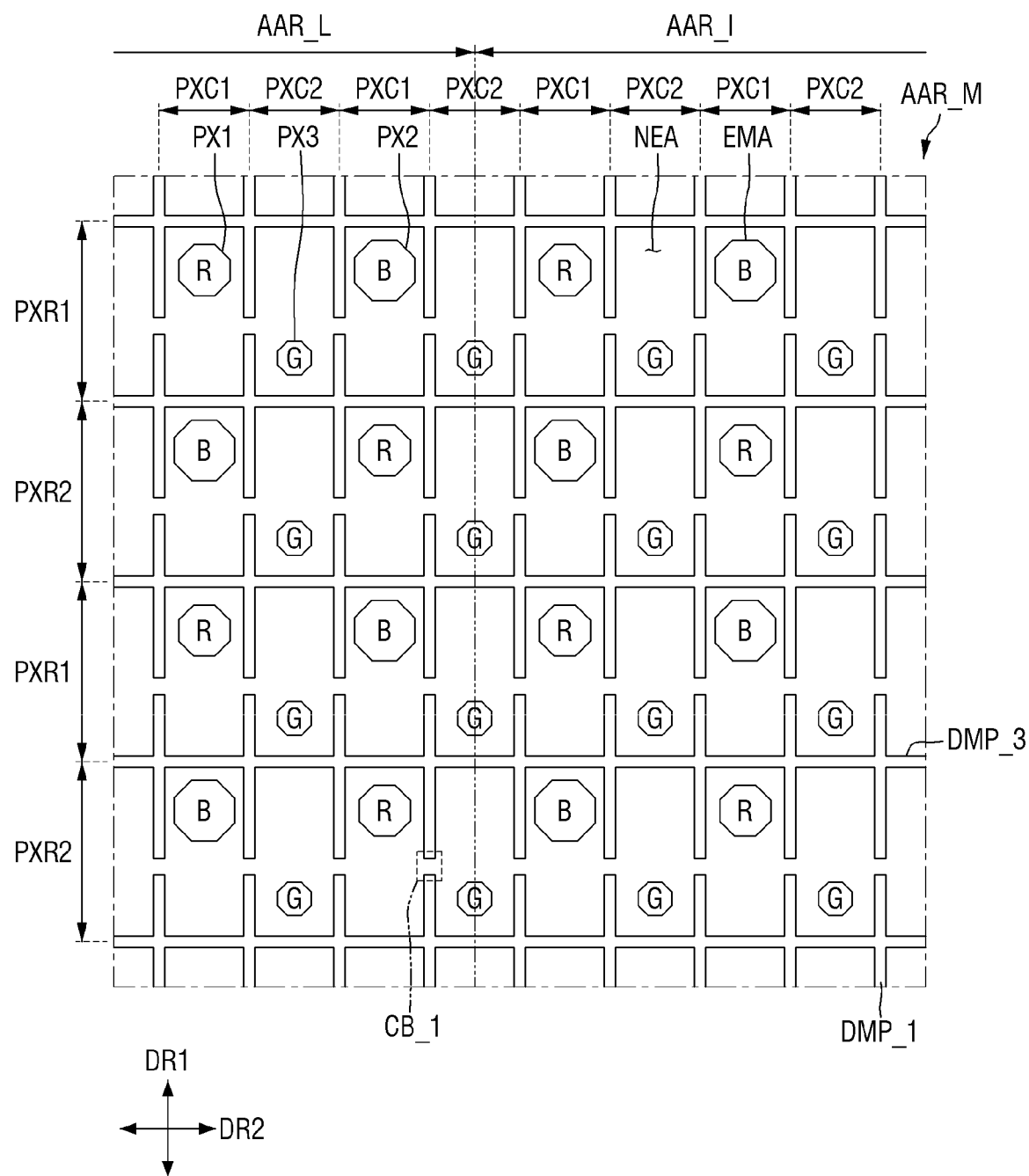
FIG. 12 is a diagram showing a portion of a layout of connection wires and dummy wiring patterns in a main active area of a display device according to an exemplary embodiment of the present disclosure.

FIG. 10 is a diagram showing a layout of a plurality of wires arranged in an active area of a display device according to an exemplary embodiment of the present disclosure. FIG. 11 is a diagram showing a portion of a layout of connection wires and dummy wiring patterns in an active fan-out area of a display device according to an exemplary embodiment of the present disclosure. FIG. 12 is a diagram showing a portion of a layout of connection wires and dummy wiring patterns in a main active area of a display device according to an exemplary embodiment of the present disclosure. FIGS. 10 to 12 show the relative arrangement of a plurality of connection wires CNW and dummy wiring patterns DMP disposed in the active area AAR for convenience of illustration, and a plurality of signal wires SW1 and SW2 (not shown) may be further disposed in the active area AAR without deviating from the scope of the present disclosure.

Referring to FIGS. 10 to 12, a plurality of wires may be disposed to cross each other in the active area AAR of the display device 1. The active area AAR may be divided into a main active area AAR_M and an active fan-out area AAR_F. The connection wires CNW are disposed in the active fan-out area AAR_F that is adjacent to the non-active area NAR where the non-active fan-out wires NFW_1 and NFW_2 are disposed. The plurality of signal wires SW1 and SW2 may extend in the first direction DR1 through the active fan-out area AAR_F and the main active area AAR_M.

The connection wires CNW may be disposed at the boundaries of the pixels PX and may not overlap the emission areas EMA of the pixels PX. It is, however, to be understood that the present disclosure is not limited thereto. In some exemplary embodiments, the connection wires CNW may be disposed to partially overlap the emission areas EMA of the pixels PX. In a case where the display device 1 is a top-emission display device, the connection wires CNW crossing the pixels PX and overlapping the emission areas EMA may not affect the luminance of the pixels PX. In addition, the signal wires SW1 and SW2 may or may not overlap the emission areas EMA of the pixels PX.

In the active fan-out area AAR_F and the main active area AAR_M, the dummy wiring patterns DMP having a shape similar to the connection wires CNW but electrically isolated may be disposed. The connection wires CNW may be disposed in areas between some of the pixels PX, but not in areas between some others of the pixels PX. The connection wires CNW disposed in some areas and not all areas between the pixels PX may cause a difference in reflectance of the pixels PX. In this case, the difference in reflectance may be perceived as a certain pattern. In this regard, to reduce the difference in reflectance of the pixels PX, dummy wiring patterns DMP may be disposed in areas where the connection wires CNW are not disposed. The dummy wiring patterns DMP may reduce or eliminate the difference in reflectance that may be otherwise perceived as a certain pattern.

The dummy wiring patterns DMP may be formed of the same conductive layer as the connection wires CNW. In a case where the connection wires CNW are formed of the second data conductive layer 160, the dummy wiring patterns DMP may also be formed of the second data conductive layer 160. The dummy wiring patterns DMP may be formed together (simultaneously) with the connection wires CNW.

The dummy wiring patterns DMP may be formed in the same layer as the connection wires CNW but may be separated from the connection wires CNW. The dummy wiring patterns DMP may have floating wiring patterns that do not receive an electric signal directly.

FIG. 11 shows an arrangement of the connection wires CNW and the dummy wiring patterns DMP along the pixel columns PXC1 and PXC2 and the pixel rows PXR1 and PXR2 in the active fan-out area AAR_F. FIG. 12 shows a layout of the dummy wiring patterns DMP in the main active area AAR_M. Hereinafter, the layout of the connection wires CNW and the dummy wiring patterns DMP will be described in more detail with reference to FIGS. 11 and 12.

The connection wires CNW and the dummy wiring patterns DMP may be disposed in the areas between the pixel columns PXC and the pixel rows PXR of the pixels PX. Each of the connection wires CNW and the dummy wiring patterns DMP includes a portion extending in the first direction DR1 and a portion extending in the second direction DR2, and they may be arranged in a lattice on the entire active area AAR.

The connection wires CNW may include a first extension portion CNW_1 and a second extension portion CNW_2 extending in the first direction DR1, and a third extension portion CNW_3 extending in the second direction DR2.

Referring to FIG. 7 and FIG. 11, the first extension portion CNW_1 may extend from the non-active area NAR where the non-active fan-out wires NFW_1 and NFW_2 are disposed toward the inner active area AAR_I (i.e., the first direction DR1). A first end of the first extension portion CNW_1 may be located in the non-active area NAR, and a second end thereof may be located in the inner active area AAR_I. The first end of the first extension portion CNW_1 may be connected to the non-active fan-out wire NFW at the inner wire contact CNI.

The second extension portion CNW_2 may be connected to the third extension portion CNW_3 and may extend from the outer active area AAR_L toward the non-active area NAR (i.e., the first direction DR1). A first end of the second extension portion CNW_2 may be located in the outer active area AAR_L, and a second end thereof may be located in the non-active area NAR adjacent to the outer active areas AAR_L. The first end of the second extension portion CNW_2 may be connected to a second end of the third extension portion CNW_3. A second bent portion of the connection wire CNW may be disposed at the first end of the second extension portion CNW_2 and/or the second end of the third extension portion CNW_3. The second end of the second extension portion CNW_2 may be connected to the signal wires SW1 and SW2 via the contact electrode CNE at the outer wire contact.

The third extension portion CNW_3 may be connected to the first extension portion CNW_1 and may extend in the second direction DR2 from the inner active area AAR_I toward the outer active area AAR_L. A first end of the third extension portion CNW_3 may be located in the inner active area AAR_I, and the second end thereof may be located in the outer active area AAR_L.

The first end of the third extension portion CNW_3 may be connected to the second end of the first extension portion CNW_1. A first bent portion of the connection wire CNW may be disposed at the first end of the third extension portion CNW_3 and/or the second end of the first extension portion CNW_1. The third extension portion CNW_3 may be disposed entirely in the active area AAR.

The first extension portion CNW_1 and the second extension portion CNW_2 of the connection wire CNW may be disposed in an area between the pixel columns PXC in the active area AAR. The third extension portion CNW_3 of the connection wire CNW may be disposed in an area between the pixel rows PXR in the active area AAR.

The ends of the first extension portion CNW_1, the second extension portion CNW_2, and the third extension portion CNW_3 may cross each other. For example, the first end and the second end of the third extension portion CNW_3 may cross and extend beyond the first extension portion CNW_1 and the second extension portion CNW_2, respectively. The length of the third extension portion CNW_3 may be greater than the distance between the first extension portion CNW_1 and the second extension portion CNW_2 in the second direction DR2, and both ends of the third extension portion CNW_3 may cross the end of each of the first extension portion CNW_1 and the second extension portion CNW_2. Similarly, the end of each of the first extension portion CNW_1 and the second extension portion CNW_2 disposed in the active area AAR may cross and may extend beyond the third extension portion CNW_3. It is, however, to be understood that the present disclosure is not limited thereto. For example, the ends of the first, second, and third extension portions CNW_1, CNW_2, and CNW_3 of the connection wire CNW may be connected with one another without crossing each other, and the connection wire CNW may be bent at the portions where the extension portions CNW_1, CNW_2 and CNW_3 are connected.

Although not shown in the drawings, the plurality of signal wires SW1 and SW2 may extend in the first direction DR1. The plurality of signal wires SW1 and SW2 may also be disposed in an area between the pixel columns PXC in the active area AAR, and may cross the third extension portion CNW_3 of the connection wires CNW passing through an area between the pixel rows PXR. The signal wires SW1 and SW2 and the third extension portion CNW_3 of the connection wire CNW may overlap each other in the thickness direction where they cross each other.

The outer data lines may be connected to the non-active fan-out wires NFW through the connection wires CNW. The plurality of connection wires CNW may be connected to the non-active fan-out wires NFW, respectively, and they may be electrically connected to the signal wires SW1 and SW2 in the outer active area AAR_L. In FIG. 11, the outer data lines are shown to be connected through first to fourth connection wires CNW #1 to CNW #4. It is to be understood that a larger number of connection wires CNW may be disposed in the active fan-out area AAR_F.

The farther an outer data line is located in the active area AAR, the farther one of the non-active fan-out wires NFW it may be connected to. In other words, a data line DL adjacent to the inner active area AAR_I among the plurality of outer data lines may be connected to a relatively close non-active fan-out wire NFW. As the signal wires SW1 and SW2 of the outer data line are farther away from one side of the second direction DR2, the non-active fan-out wire NFW positioned on the other side of the second direction DR2 may be connected thereto. The connection wires CNW of the outer data lines located more to the outside may surround the connection wires CNW of the outer data lines located more to the inside when viewed from the top. Each of the connection wires CNW may have the shortest path in a space between the pixel columns PXC or the space between the pixel rows PXR, so that the space between the pixel columns PXC or the space between the pixel rows PXR can be utilized as the paths of the connection wires CNW sequentially without wasting the space.

Referring to FIG. 11, the first extension portion CNW_1 of the first connection wire CNW #1 may be disposed in a space between the fifth pixel column PXC1 and the sixth pixel column PXC2, and the second extension portion CNW_2 may be disposed in a space between the second pixel column PXC2 and the third pixel column PXC1 from the left of the drawing. The third extension portion CNW_3 of the first connection wire CNW #1 may be disposed in a space between the first pixel row PXR1 and the second pixel row PXR2 from the bottom of the drawing.

The second connection wire CNW #2 may be disposed to surround the first connection wire CNW #1. The first extension portion CNW_1 of the second connection wire CNW #2 may be disposed in a space between the sixth pixel column PXC2 and the seventh pixel column PXC1, and the second extension portion CNW_2 may be disposed in a space between the first pixel column PXC1 and the second pixel column PXC2 from the left of the drawing. The third extension portion CNW_3 of the second connection wire CNW #2 may be disposed in a space between the second pixel row PXR1 and the third pixel row PXR2 from the bottom of the drawing.

Similarly, the third connection wire CNW #3 may surround the second connection wire CNW #2, and the fourth connection wire CNW #4 may surround the third connection wire CNW #3.

The extension portions of the connection wires CNW may cross each other, and an extension portion may extend beyond another extension portion. Such arrangement of the connection wires CNW may be perceived as a certain pattern in the active fan-out area AAR_F. As described above, the dummy wiring patterns DMP are disposed in the active fan-out area AAR_F to prevent the connection wires CNW from being perceived as a pattern. The dummy wiring patterns DMP may be disposed in a shape similar to the extension portions of the connection wires CNW, and at least a portion of the dummy wiring patterns DMP may cross the extension portions of the connection wires CNW. The dummy wiring patterns DMP may include patterns extending in the first direction DR1 and the second direction DR2 to further improve an issue of perceivable difference in reflectance.

The dummy wiring patterns DMP includes a first dummy wiring pattern DMP_1 extending in the first direction DR1 and a second dummy wiring pattern DMP_2 extending in the second direction DR2. The first dummy wiring pattern DMP_1 and the second dummy wiring pattern DMP_2 may be disposed in the active fan-out area AAR_F and may cross the connection wires CNW.

Each of the first dummy wiring patterns DMP_1 disposed in the active fan-out area AAR_F may cross the third extension portion CNW_3 of the connection wire CNW. Each of the first dummy wiring patterns DMP_1 may be connected to the third extension portion CNW_3 of the connection wire CNW where they cross each other. Each of the second dummy wiring patterns DMP_2 may cross the first extension portion CNW_1 or the second extension portion CNW_2 of the connection wire CNW. The second dummy wiring pattern DMP_2 may be disposed in the outer active area AAR_L and the inner active area AAR_I in the active fan-out area AAR_F. The second dummy wiring patterns DMP_2 may be connected to the first extension portion CNW_1 or the second extension portion CNW_2 of the connection wire CNW where they cross each other.

The first dummy wiring patterns DMP_1 may be separated and spaced apart from one another in the first direction DR1. The first dummy wiring pattern DMP_1 crossing the third extension portion CNW_3 of a connection wire CNW may be separated from the first dummy wiring pattern DMP_1 crossing the third extension portion CNW_3 of another connection wire CNW. Some of the first dummy wiring patterns DMP_1 may be disposed along the same extension line as the first extension portion CNW_1 and the second extension portion CNW_2 of another connection wire CNW, but may be separated and spaced apart from them. Accordingly, even if the first dummy wiring pattern DMP_1 is connected to the third extension portion CNW_3 of the connection wire CNW, the connection wires CNW can be separated from each other.

Similarly, the second dummy wiring patterns DMP_2 may be separated and spaced apart from one another in the second direction DR2. The second dummy wiring pattern DMP_2 crossing the first extension portion CNW_1 or the second extension portion CNW_2 of a connection wire CNW may be separated from the second dummy wiring pattern DMP_2 crossing the first extension portion CNW_1 or the second extension portion CNW_2 of another connection wire CNW. Some of the second dummy wiring patterns DMP_2 may be disposed along the same extension line as the third extension portion CNW_3 of another connection wire CNW, but may be separated and spaced apart from it. Accordingly, even if the second dummy wiring pattern DMP_2 is connected to the first extension portion CNW_1 or the second extension portion CNW_2 of the connection wire CNW, the connection wires CNW can be separated from each other.

Referring to FIG. 12, the dummy wiring pattern DMP may further include a third dummy wiring pattern DMP_3 disposed in the main active area AAR_M where the connection wires CNW are not disposed. The third dummy wiring pattern DMP_3 may extend in the second direction DR2, and the first dummy wiring pattern DMP_1 disposed in the main active area AAR_M may cross the third dummy wiring pattern DMP_3. In comparison with the second dummy wiring pattern DMP_2, the third dummy wiring pattern DMP_3 may be disposed from the outer active area AAR_L to the inner active area AAR_I.

The first dummy wiring patterns DMP_1 and the second dummy wiring patterns DMP_2 may be arranged in a pattern similar to the connection wires CNW in the active fan-out area AAR_F, thereby improving an issue that the connection wires CNW are perceivable in the active fan-out area AAR_F. The third dummy wiring patterns DMP_3 may also be arranged in a pattern similar to the connection wires CNW in the main active area AAR_M, thereby preventing an issue that the connection wires CNW are perceivable in the entirely active area as a pattern.

The dummy wiring patterns DMP and the connection wires CNW may be formed as the wires extending in the first direction DR1 and the second direction DR2 throughout the entire active area AAR and may be partially disconnected. Some of the wires extending in the first direction DR1 may be disconnected at a first disconnection CB_1 to form one of the first extension portion CNW_1 and the second extension portion CNW_2 of each of the connection wires CNW, and the first dummy wiring pattern DMP_1. Some of the wires extending in the second direction DR2 may be disposed in the main active area AAR_M to form the third dummy wiring pattern DMP_3, and some others may be disconnected at a second disconnection CB_2 in the active fan-out area AAR_F to form one of the third extension portion CNW_3 of each of the connection wires CNW and the second dummy wiring pattern DMP_2.

A plurality of first disconnections CB_1 may be disposed in each pixel row PXR to be spaced apart from one another in the second direction DR2. A plurality of second disconnection portions CB_2 may be disposed in each pixel column PXC to be spaced apart from one another in the first direction DR1. The first disconnections CB_1 and the second disconnections CB_ may be spaced apart from one another in a regular pattern, and may be arranged throughout the active area AAR. The first disconnections CB_1 and the second disconnections CB_2 may not be disposed in some pixel columns PXC or pixel rows PXR. For example, each of the connection wires CNW may include the first extension portion CNW_1, the second extension portion CNW_2. and the third extension portion CNW_3 that are continuous continuously connected one another. In addition, the third dummy wiring pattern DMP_3 may be continuous disposed in the second direction DR2. Because there may be wires separated at the disconnections CB_1 and CB_2 while the other wires are disposed throughout the active area AAR, a difference in reflectance due to the disconnections CB_1 and CB_2 may be perceived as a pattern. In particular, the connection wires CNW and the dummy wiring patterns DMP are formed of the second data conductive layer 160, and a portion of the upper surface of the fifth insulating layer 125 disposed thereon may be indented or recessed due to the first and second disconnections CB_1 and CB_2. As a result, the pixel electrode 170 disposed on the fifth insulating layer 125 may also form a level difference causing a difference of the reflectance of incident light.

According to an exemplary embodiment of the present disclosure, the display device 1 may include a plurality of dummy grooves HT_1 that overlap the connection wires CNW and are spaced apart from one another by the same spacing as the first and second disconnections CB_1 and CB_2. A dummy groove HT_1 may have an arrangement similar to the first and second disconnections CB_1 and CB_2 in the active fan-out area AAR_F.

The first disconnections CB_1 may be arranged in at least one direction between adjacent ones of the first dummy wiring patterns DMP_1 that are spaced apart from each other by a constant spacing. The first disconnections CB_1 may be arranged in the first direction DR1 and may be disposed in a space between neighboring pixel columns PXC, and may also be arranged in the second direction DR2 in a pixel row PXR. The first extension portions CNW_1 or the second extension portions CNW_2 of the connection wire CNW may be disposed on the same line along the direction in which the first disconnections CB_1 are arranged. Accordingly, the portions where the first disconnections CB_1 are disposed may be distinguished from the portions where the first extension portion CNW_1 or the second extension portion CNW_2 are disposed and may be perceived as a pattern. To prevent this, the plurality of dummy grooves HT_1 overlapping the first extension portion CNW_1 or the second extension portion CNW_2 of the connection wire CNW may be disposed.

The plurality of dummy grooves HT_1 may be spaced apart from one another by a spacing substantially equal to the spacing between the disconnections CB_1 and CB_2 while being spaced apart from the disconnections CB_1 and CB_2. For example, the dummy grooves HT_1 may be disposed on the first extension portion CNW_1 or the second extension portion CNW_2 of the connection wire CNW, and some of the dummy grooves HT_1 may be disposed to lie on the same line as the first disconnections CB_1. The spacing between the first disconnections CB_1 may be substantially equal to the spacing between the dummy groove HT_1 and the first disconnection CB_1.

The dummy grooves HT_1 may lie on the same line as the first disconnections CB_1 in the active fan-out area AAR_F. The first disconnection portions CB_1 and the dummy grooves HT_1 may be arranged in the first direction DR1 in a space between neighboring pixel columns PXC. In addition, the first disconnections CB_1 and second dummy grooves HT_2 (see FIG. 22) may be arranged in the second direction DR2 within the same pixel row PXR. The dummy grooves HT_1 included in the display device 1 may prevent a pattern from being perceived that may be otherwise perceived due to the difference in reflectance caused by the first and second disconnections CB_1 and CB_2.

Figure 13:
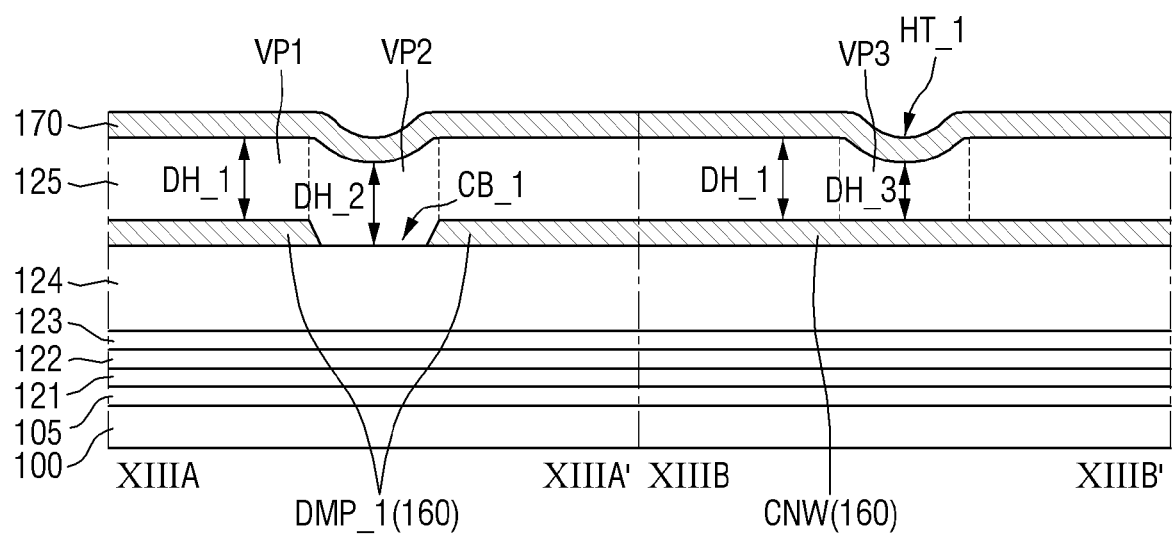
FIG. 13 is a cross-sectional view taken along lines XIIIA-XIIIA' and XIIIB-XIIIB' of FIG. 11.

FIG. 13 is a cross-sectional view taken along lines XIIIA-XIIIA' and XIIIB-XIIIB' of FIG. 11. A cross section shown in FIG. 13 traverses a first disconnection CB_1 and a dummy groove HT_1 in the active fan-out area AAR_F. For convenience of illustration, the elements disposed on the pixel electrode 170 are omitted in FIG. 13.

Referring to FIG. 13, the second data conductive layer 160 may include a dummy wiring pattern DMP and a connection wires CNW. The dummy wiring pattern DMP may include a first dummy wiring pattern DMP_1 that is separated at a first disconnection CB_1 in the active fan-out area AAR_F. The fifth insulating layer 125 may be disposed to cover the second data conductive layer 160. The upper surface of the fifth insulating layer 125 may be recessed at a portion corresponding to the first disconnection CB_1 due to the level difference of the underlying layer.

For example, the fifth insulating layer 125 may include a first portion VP1 covering a portion of the first dummy wiring pattern DMP_1 and a connection wire CNW, and a second portion VP2 covering the first disconnection CB_1. The first portion VP1 may have a thickness DH_1 and may have a flat upper surface.

On the other hand, the upper surface of the second portion VP2 of the fifth insulating layer 125 covering the first disconnection CB_1 may be recessed due to the level difference of the second data conductive layer 160 disposed thereunder. The second portion VP2 of the fifth insulating layer 125 may have a thickness DH_2 that may be the substantially same as the first portion VP1, and the upper surface may be recessed from the upper surface of the first portion VP1 by the thickness of the second data conductive layer 160. By applying a uniform insulating material onto the entire upper surface of the second data conductive layer 160 and curing it to form the fifth insulating layer 125, a portion of the upper surface of the fifth insulating layer 125 may be recessed due to the level difference thereunder. At the first disconnection CB_1 of the second data conductive layer 160, a portion of the upper surface of the fifth insulating layer 125 may be recessed at the second portion VP2, and a portion of the upper surface of the pixel electrode 170 disposed thereon may also be recessed. As the pixel electrode 170 has such shape, the reflectance of light incident may vary depending on a position, and thus the portion where the first disconnection CB_1 is located may be distinguished and perceived as a pattern.

According to an exemplary embodiment of the present disclosure, the fifth insulating layer 125 may include the dummy grooves HT_1 that are spaced apart from one another by the substantially same spacing as the first disconnections CB_1 and overlap the connection wire CNW of the second data conductive layer 160. Each of the dummy grooves HT_1 may be formed in a third portion VP3 of the fifth insulating layer 125 having a thickness DH_3 that is different from the other portions of the fifth insulating layer 125. The thickness DH_3 of the third portion VP3 may be different from the thickness DH_1 of the first portion VP1 and the thickness DH_2 of the second portion VP2, and the dummy groove HT_1 may be formed on the upper surface of the third portion VP3.

The thickness DH_3 of the third portion VP3 of the fifth insulating layer 125 where the dummy groove HT_1 is formed may be smaller than the thickness DH_1 of the first portion VP1 and the thickness DH_2 of the second portion VP2. The first portion VP1 and the second portion VP2 may have a uniform thickness conforming to the level formed thereunder, but the third portion VP3 may have a relatively small thickness.

A portion of the upper surface of the pixel electrode 170 disposed on the fifth insulating layer 125 that corresponds to the dummy groove HT_1 may be recessed due to the first disconnection CB_1 disposed thereunder. The dummy grooves HT_1 may be spaced apart from one another by the same spacing as the first disconnections CB_1 and may be arranged in a regular pattern as well.

As shown in FIG. 11, the dummy grooves HT_1 may be disposed on the wires arranged in the first direction DR1 in the spaces between the pixel columns PXC in the substantially same areas as the first disconnections CB_1. For example, the dummy grooves HT_1 and the first disconnections CB_1 that are arranged in the first pixel row PXR1 from the bottom may be spaced apart at a regular distance, and may be arranged between adjacent pixel columns PXC. Similarly, the dummy grooves HT_1 and the first disconnections CB_1 that are arranged in each pixel row PXR may be arranged at a regular distance in the active fan-out area AAR_F. Portions of the fifth insulating layer 125 disposed on the second data conductive layer 160 may include a level difference in the upper surface formed due to the dummy grooves HT_1 and the first disconnections CB_1, so that there may be no difference between the portions where the first disconnections CB_1 are disposed and the portions where the dummy grooves HT_1 are formed on the pixel electrode 170. In this manner, the active fan-out area AAR_F where the first disconnections CB_1 are formed can have a uniform reflectance regardless of the positions, preventing an issue that the first disconnection CB_1 may be seen as a pattern due to a difference in reflectance.

The dummy groove HT_1 may be formed by forming an upper surface of the fifth insulating layer 125 with an insulating material using a halftone mask and curing it during a process of forming the fifth insulating layer 125. By forming level differences using the halftone mask, i.e., recesses in the upper surface of the fifth insulating layer 125 consistent with the level differences caused by the first disconnections CB_1, the dummy grooves HT_1 may be formed in the fifth insulating layer 125 similar to the recesses that are formed in the fifth insulating layer 125 due to the first disconnections CB_1.

Figure 14:
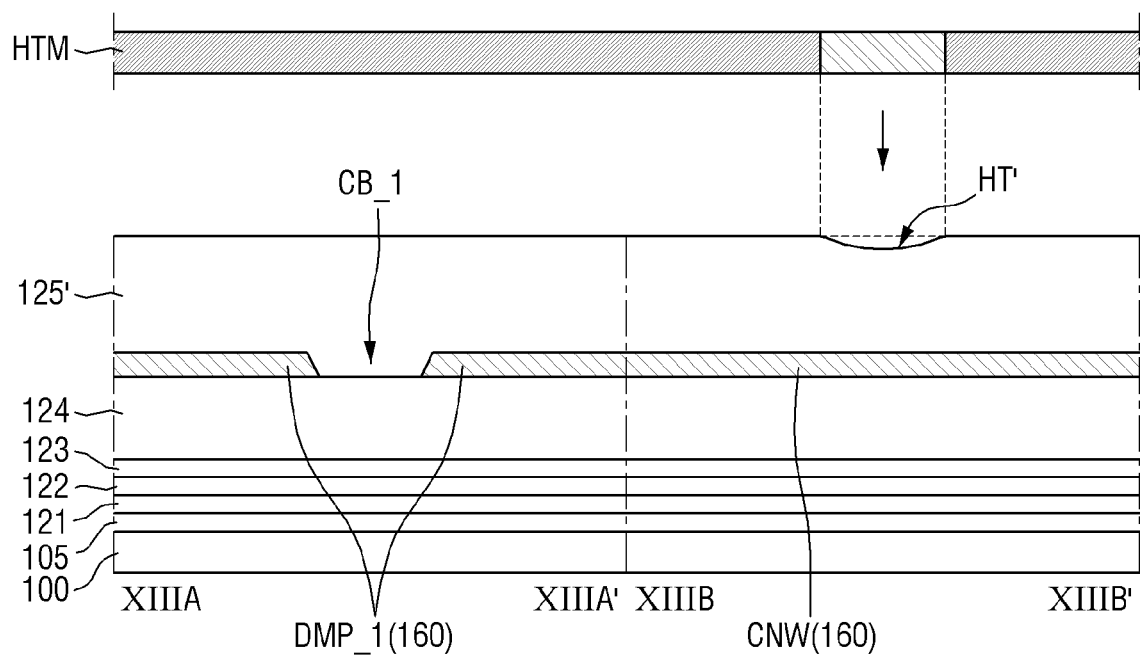
FIG. 14 and FIG. 15 are cross-sectional views showing processing steps of fabricating a display device according to an exemplary embodiment of the present disclosure.
Figure 15:
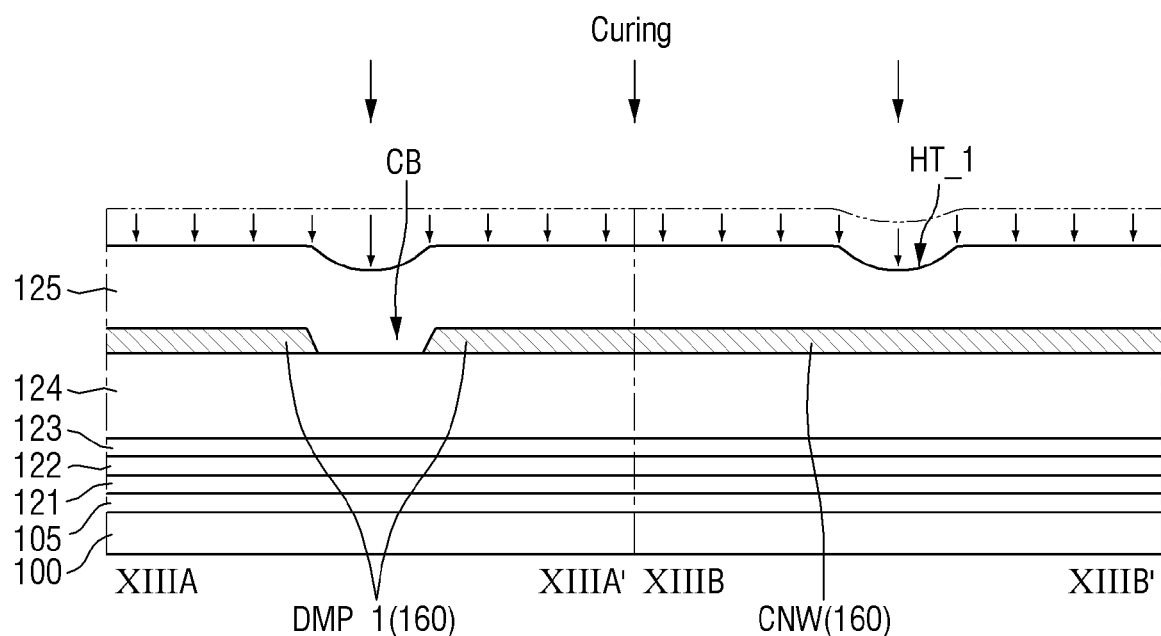

FIGS. 14 and 15 are cross-sectional views showing processing steps of fabricating a display device according to an exemplary embodiment of the present disclosure.

A process of forming the fifth insulating layer 125 will be described with reference to FIGS. 14 and 15. Initially, an insulating material 125' is formed on the second data conductive layer 160. The insulating material layer 125' may be cured during a subsequent process to form the fifth insulating layer 125. The insulating material layer 125' may include an organic insulating material and thus may have a relatively flat upper surface before it is cured. In the subsequent process, the upper surface of the insulating material layer 125' may be recessed at portions due to the level difference thereunder as organic insulating material is cured through exposure and curing processes. In particular, portions of the insulating material layer 125' disposed on the first disconnection CB_1 of the second data conductive layer 160 may have a recessed upper surface during the curing process due to the level difference thereunder.

On the other hand, the insulating material layer 125' disposed on the connection wire CNW may have a flat upper surface because no level difference is formed thereunder. According to an exemplary embodiment of the present disclosure, a dummy groove HT_1 may be formed in the fifth insulating layer 125 by performing an exposure process on a portion of the insulating material layer 125'. In an exemplary embodiment, a portion of the insulating material layer 125' on the connection wire CNW may be irradiated with light using a halftone mask HTM, and a recess HT' may be formed in a portion of the upper surface of the insulating material layer 125'.

When the insulating material layer 125' is exposed using a halftone mask HTM, light may not be irradiated onto the portions other than the recess HT' and may be irradiated onto only the portion of the insulating material layer 125'. As a result, the portion of the upper surface of the insulating material layer 125' irradiated with light through the halftone mask HTM may be recessed.

Subsequently, referring to FIG. 15, the fifth insulating layer 125 may be formed by curing the insulating material layer 125'. When the insulating material layer 125' is cured, the height of the insulating material layer 125' may be lowered, and accordingly the upper surface may be curved to have the level difference at portions depending on the underlying layer. The height of the upper surface of the insulating material layer 125' at portions where no level difference is formed in the underlying layer may be uniformly lowered. In doing so, the recess HT' may become a dummy groove HT_1 in the upper surface of the fifth insulating layer 125. After the insulating material layer 125' is cured, the fifth insulating layer 125 is formed to include a recess formed in the portion overlapping the first disconnection CB_1, i.e., the second portion VP2 and a recess formed by the dummy groove HT_1, i.e., the third portion VP3. The first portion VP1 of the fifth insulating layer 125 has a flat upper surface while the second portion VP2 and the third portion VP3 have a recessed upper surface. Accordingly, the upper surface of the fifth insulating layer 125 may have a pattern of recesses spaced apart from one another regularly throughout the active area AAR.

The display device 1 according to the exemplary embodiment of the present disclosure may include the dummy grooves HT_1 formed in the fifth insulating layer 125 preventing an issue that the first disconnections CB_1 may be perceived as a pattern in the active fan-out area AAR_F.

Hereinafter, display devices according to a variety of exemplary embodiments of the present disclosure will be described reference to other drawings.

Figure 16:
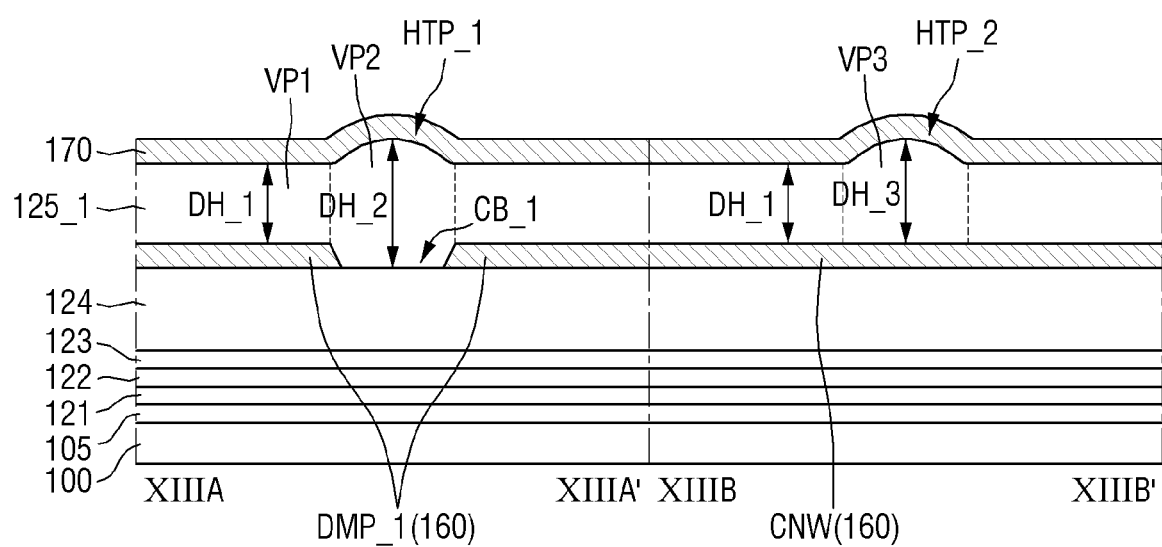
FIG. 16 is a cross-sectional view showing a portion of a structure of a dummy wire, a connection wire, and a fifth insulating layer of a display device according to another exemplary embodiment.

FIG. 16 is a cross-sectional view showing a portion of a structure of a dummy wire, a connection wire, and a fifth insulating layer of a display device according to another exemplary embodiment.

The shape of the display device 1 is not particularly limited herein as long as the fifth insulating layer 125 can be shaped regularly to reduce a difference in reflectance that may be caused by the first disconnections CB_1. In some exemplary embodiments, the fifth insulating layer 125 may include protruding patterns HTP that are formed at the second portion VP2 where the first disconnection CB_1 is formed and at the third portion VP3 that are spaced apart from the second portion VP2. The protruding patterns HTP may be spaced apart from one another by a constant spacing in the active fan-out area AAR_F to prevent the portions where the first disconnections CB_1 are disposed from looking different from the other portions, therefore being perceived as a pattern.

Referring to FIG. 16, a fifth insulating layer 125_1 may include the protruding patterns HTP that are formed on a portion of the upper surface corresponding to the first disconnections CB_1. The protruding patterns HTP may include a first protruding pattern HTP_1 that are formed on the second portion VP2 of the fifth insulating layer 125 overlapping the first disconnection CB_1, and a second protruding pattern HTP_2 that are formed on the third portion VP3 spaced apart from the second portion VP2 and overlapping the connection wire CNW. The thickness DH_1 of the first portion VP1 where no protruding pattern HTP is formed may be different from the thickness DH_2 of the second portion VP2 and the thickness DH_3 of the third portion VP3 where the protruding patterns HTP are formed. In comparison with the exemplary embodiment of FIG. 13, in the display device 1 of FIG. 16, the thickness DH_1 of the first portion VP1 of the fifth insulating layer 125 is smaller than the thickness DH_2 of the second portion VP2 and/or the thickness DH_3 of the third portion VP3.

The first protruding pattern HTP_1 and the second protruding pattern HTP_2 may be spaced apart from each other by a constant spacing, and the fifth insulating layer 125 may have a pattern of recesses having a constant spacing in the active fan-out area AAR_F. The display device 1 may prevent an issue of a pattern being perceived as a pattern due to the difference in reflectance in the active fan-out area AAR_F.

Figure 17:
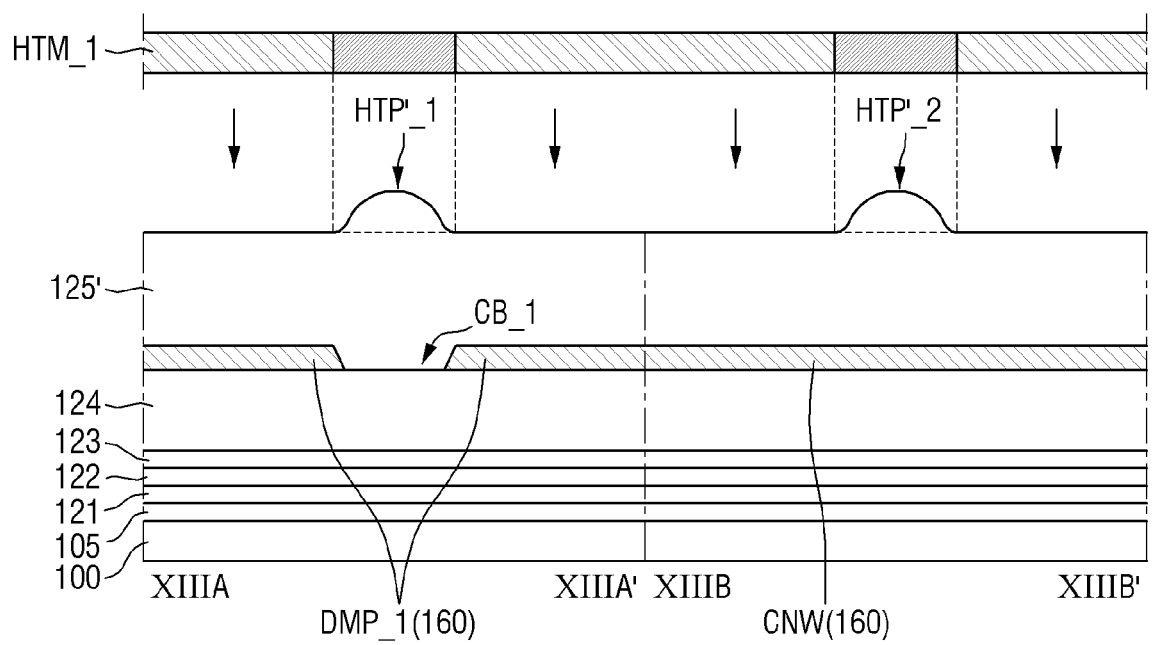
FIG. 17 and FIG. 18 are cross-sectional views showing processing steps of a method of fabricating the display device shown in FIG. 16.
Figure 18:
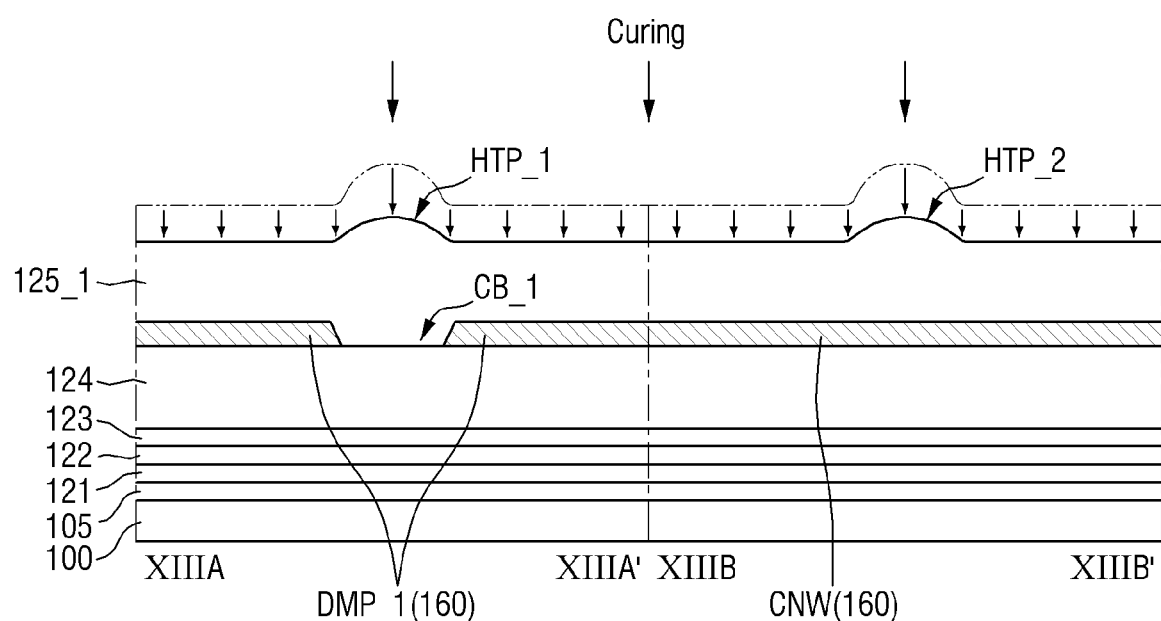

FIGS. 17 and 18 are cross-sectional views showing processing steps of a method of fabricating the display device 1 shown in FIG. 16.

Referring to FIGS. 17 and 18, the protruding patterns HTP of the fifth insulating layer 125_1 may also be formed using a halftone mask HTM_1. In comparison with the exemplary embodiment of FIGS. 14 and 15, portions of the insulating material 125' other than the second portion VP2 and the third portion VP3 may be irradiated with light via the halftone mask HTM_1. A first protruding portion HTP'_1 and a second protruding portion HTP'_2 may be formed on the insulating material layer 125' and cured to form the fifth insulating layer 125_1, so that the first protruding pattern HTP_1 and the second protruding pattern HTP_2 may be formed on the upper surface of the fifth insulating layer 125_1. The second protruding pattern HTP_2 may be arranged similarly to the first protruding pattern HTP_1 that overlaps the first disconnection CB_1 to form a uniform pattern of protrusions on the upper surface of the fifth insulating layer 125_1 in the active fan-out area AAR_F. The display device 1 can prevent the pattern from being perceived as a pattern due to the difference in reflectance that may be otherwise caused by the first disconnection CB_1.

It is understood that, if the unevenness formed in the second portion VP2 of the fifth insulating layer 125 due to the first and second disconnections CB_1 and CB_2 can be removed, it may be possible to eliminate the dummy grooves HT_1 or the protruding patterns HTP_2 formed in the third portion VP3 disposed on the connection wire CNW.

Figure 19:
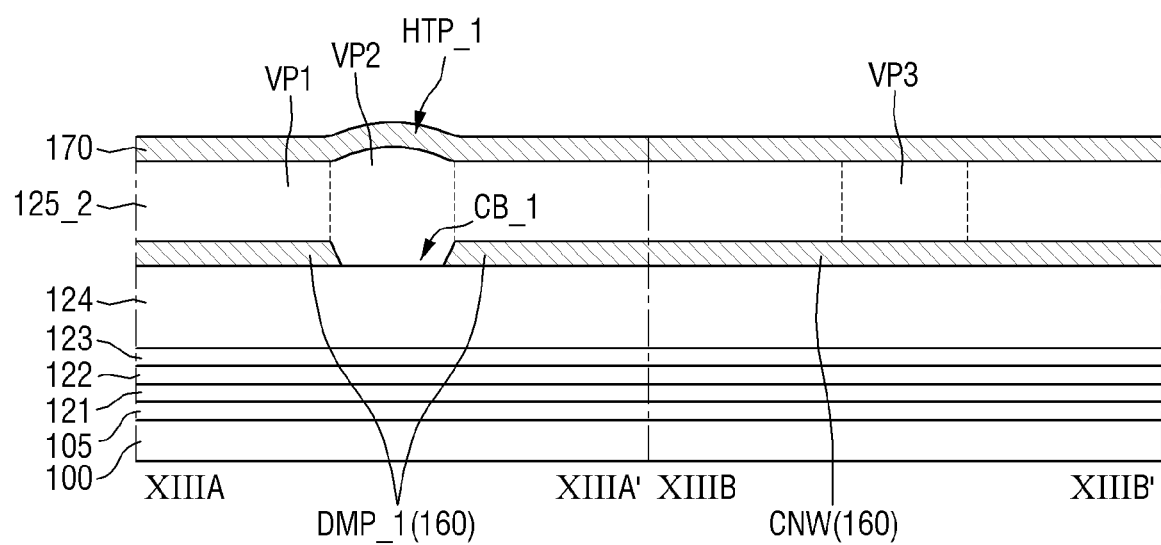
FIG. 19 is a cross-sectional view showing a portion of a structure of a dummy wire, a connection wire, and a fifth insulating layer of a display device according to yet another exemplary embodiment.
Figure 20:
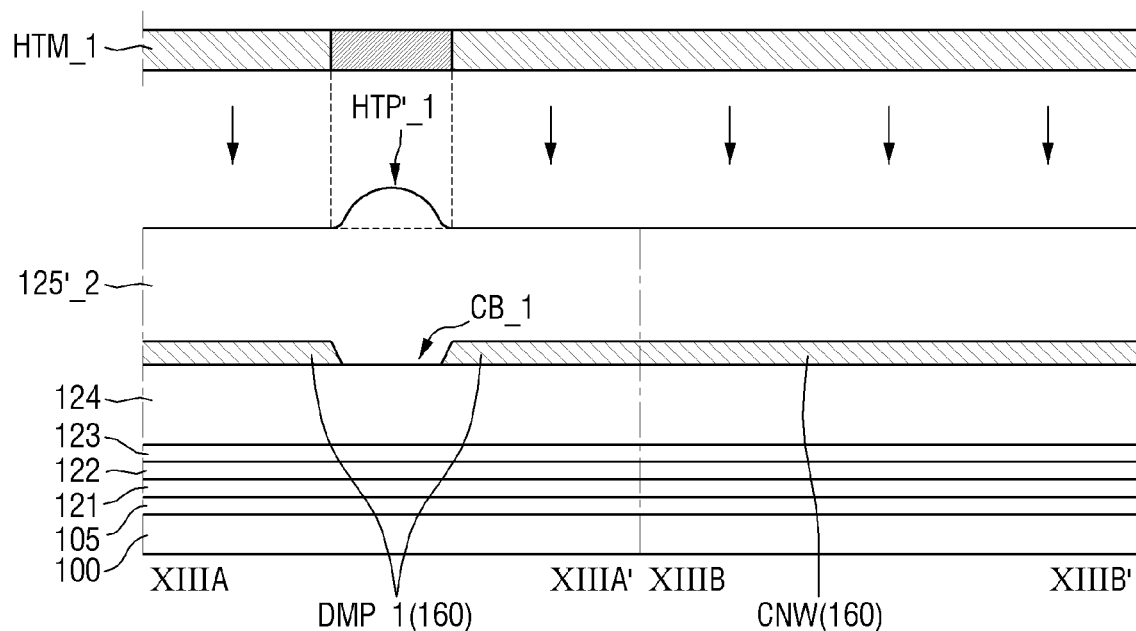
FIG. 20 and FIG. 21 are cross-sectional views showing processing steps of a method of fabricating the display device shown in FIG. 19.
Figure 21:
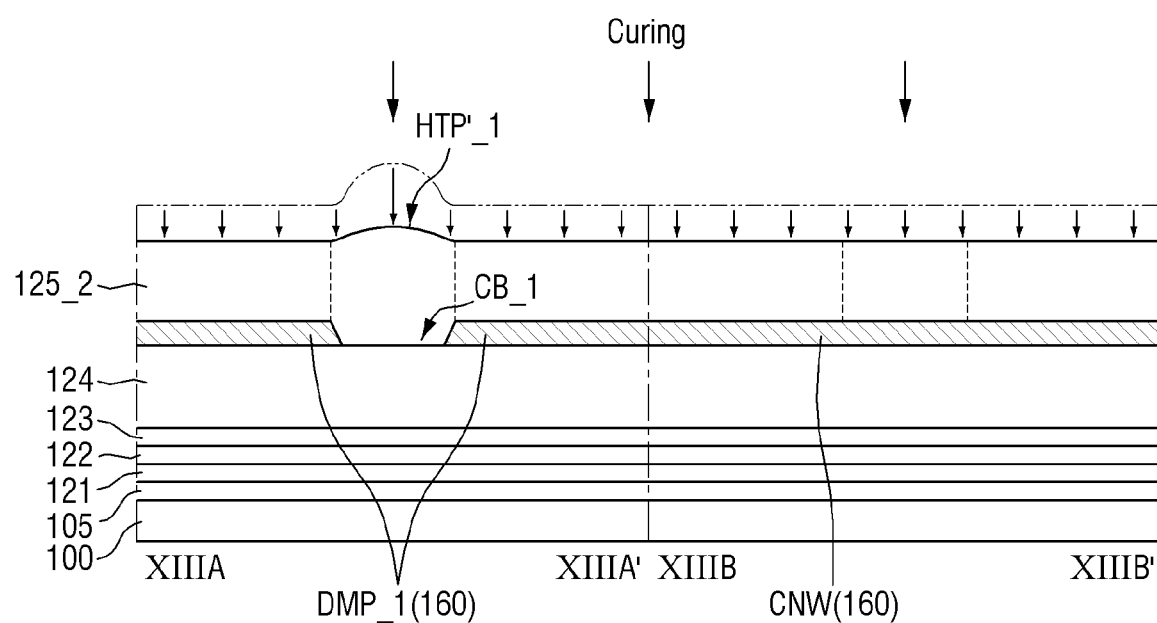

FIG. 19 is a cross-sectional view showing a portion of a structure of a dummy wire, a connection wire, and a fifth insulating layer of a display device according to yet another exemplary embodiment. FIGS. 20 and 21 are cross-sectional views showing processing steps of a method of fabricating the display device 1 shown in FIG. 19.

Referring to FIGS. 19 to 21, a fifth insulating layer 125_2 includes the first protruding pattern HTP_1 corresponding to the upper surface of the second portion VP2, while the upper surface of the first portion VP1 and the third portion VP3 may be flat. The thickness of the first portion VP1 of the fifth insulating layer 125_2 may be equal to the thickness of the third portion VP3 thereof, and the thickness of the second portion VP2 of the fifth insulating layer may be greater than the thickness of the first and third portions VP1 and VP3. This exemplary embodiment is different from the exemplary embodiment of FIG. 16 in that the second protruding pattern HTP_2 formed on the third portion VP3 is eliminated in the fifth insulating layer 125_2.

During the process of forming the fifth insulating layer 125_2, a protrusion HTP'_1 is formed at a portion of an insulating material layer 125'_2 that overlaps a first disconnection CB_1 using a halftone mask HTM_1. By curing the insulating material layer 125'_2, a fifth insulating layer 125_2 having a relatively flat upper surface is formed. The second portion VP2 corresponding to the first disconnection CB_1 may be partially protruded or embossed. It is to be understood that the first protruding pattern HTP_1 of this exemplary embodiment may have a relatively low height, so that the upper surface of the fifth insulating layer 125_2 may be formed to be relatively flat reducing the difference in reflectance throughout the active fan-out area AAR_F. The display device 1 can reduce the recess of the fifth insulating layer 125_2 that may be otherwise formed due to the disconnection CB_1 of the first dummy wiring pattern DMP_1, and the display device 1 may improve an issue of a pattern being perceived as a pattern in the active fan-out area AAR_F. The other elements are identical to those described above, therefore, the redundant description will be omitted.

Figure 22:
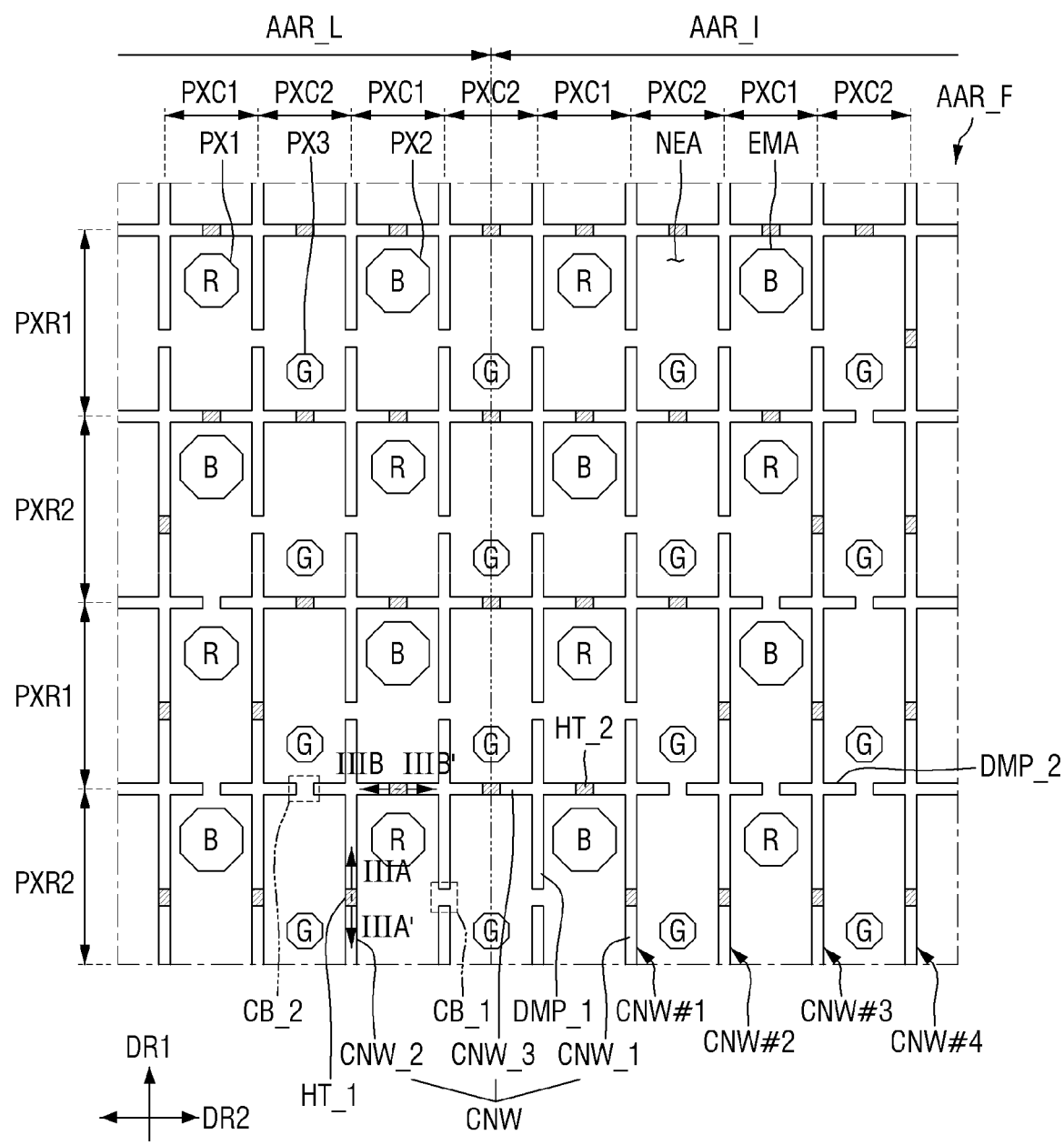
FIG. 22 is a diagram showing a portion of a layout of connection wires and dummy wiring patterns in an active fan-out area of a display device according to another exemplary embodiment of the present disclosure.
Figure 23:
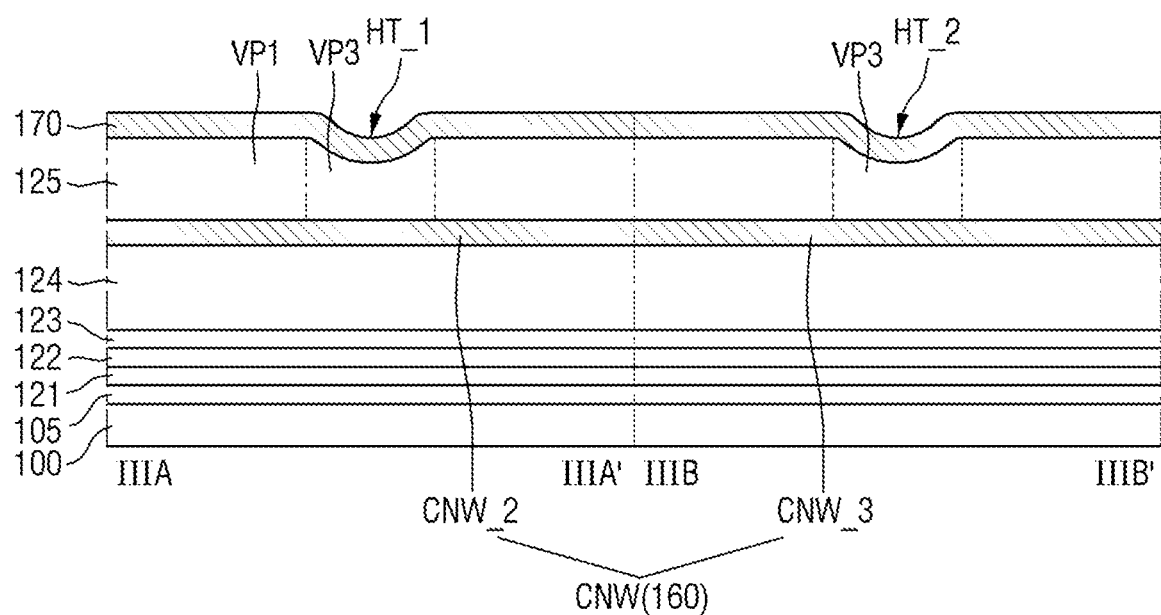
FIG. 23 is a cross-sectional view taken along lines IIIA-IIIA' and IIIB-IIIB' of FIG. 22.

FIG. 22 is a diagram showing a portion of a layout of connection wires and dummy wiring patterns in an active fan-out area of a display device according to another exemplary embodiment of the present disclosure. FIG. 23 is a cross-sectional view taken along lines IIIA-IIIA' and IIIB-IIIB' of FIG. 22.

Referring to FIGS. 22 and 23, the display device 1 may include a second disconnection CB_2 at which second dummy wiring patterns DMP_2 are separated, in addition to a first disconnection CB_1 at which the first dummy wiring patterns DMP_1 are separated. A portion of the upper surface of the fifth insulating layer 125 may be recessed due to the first disconnection CB_1 and the second disconnection CB_2, and a pattern may be perceived as a pattern. The display device 1 according to this exemplary embodiment may include first dummy grooves HT_1 and second dummy grooves HT_2 having an arrangement similar to that of the first disconnections CB_1 and the second disconnections CB_2.

The second dummy grooves HT_2 are located on the same line and spaced apart from one another by the same spacing as the second disconnections CB_2 in a manner similar to the first dummy grooves HT_1 that are located on the same line and spaced apart from one another by the same spacing as the first disconnections CB_1. The first dummy groove HT_1 has been described above, and thus only the second dummy groove HT_2 will be described in detail below.

As described above, the second dummy wiring patterns DMP_2 may extend in the second direction DR2 to cross a first extension portion CNW_1 or a second extension portion CNW_2 of a connection wire CNW. In addition, the second dummy wiring patterns DMP_2 may be disposed on the extension line of the third extension portion CNW_3 of the connection wire CNW. The second disconnections CB_2 between the second dummy wiring patterns DMP_2 spaced apart from one another by a constant spacing may be arranged in at least one direction. The second disconnections CB_2 may be arranged in the second direction DR2 and may be disposed in a space between neighboring pixel rows PXR, and may also be arranged in the first direction DR1 in a pixel column PXC. The third extension portions CNW_3 of the connection wire CNW may be disposed on the same line along the direction in which the second disconnections CB_2 are arranged. Accordingly, the portions where the second disconnections CB_2 are disposed may be distinguished from the portions where the third extension portions CNW_3 of the connection wires CNW are disposed, and may be perceived as a pattern. To prevent this, the plurality of second dummy grooves HT_2 overlapping the third extension portions CNW_3 of the connection wire CNW may be disposed.

The second dummy grooves HT_2 may lie on the same line as the second disconnections CB_2 in the active fan-out area AAR_F. The second disconnections CB_2 and the second dummy grooves HT_2 may be arranged in the second direction DR2 in a space between neighboring pixel rows PXR. In addition, the second disconnections CB_2 and the second dummy grooves HT_2 may be arranged in the first direction DR1 within the same pixel column PXC.

The second dummy groove HT_2 may be formed in the fifth insulating layer 125 overlapping the connection wire CNW in a manner similar to the first dummy groove HT_1. The first dummy groove HT_1 and the second dummy groove HT_2 may be formed by recessing a portion of the upper surface of the fifth insulating layer 125, so that the fifth insulating layer 125 includes the plurality of dummy grooves HT_1 and HT_2 in addition to the portions overlapping the disconnections CB_1 and CB_2, thereby forming a uniform pattern of recesses. Accordingly, it is possible to suppress an issue that a pattern may be perceived in the active fan-out area AAR_F due to the difference in reflectance.

Figure 24:
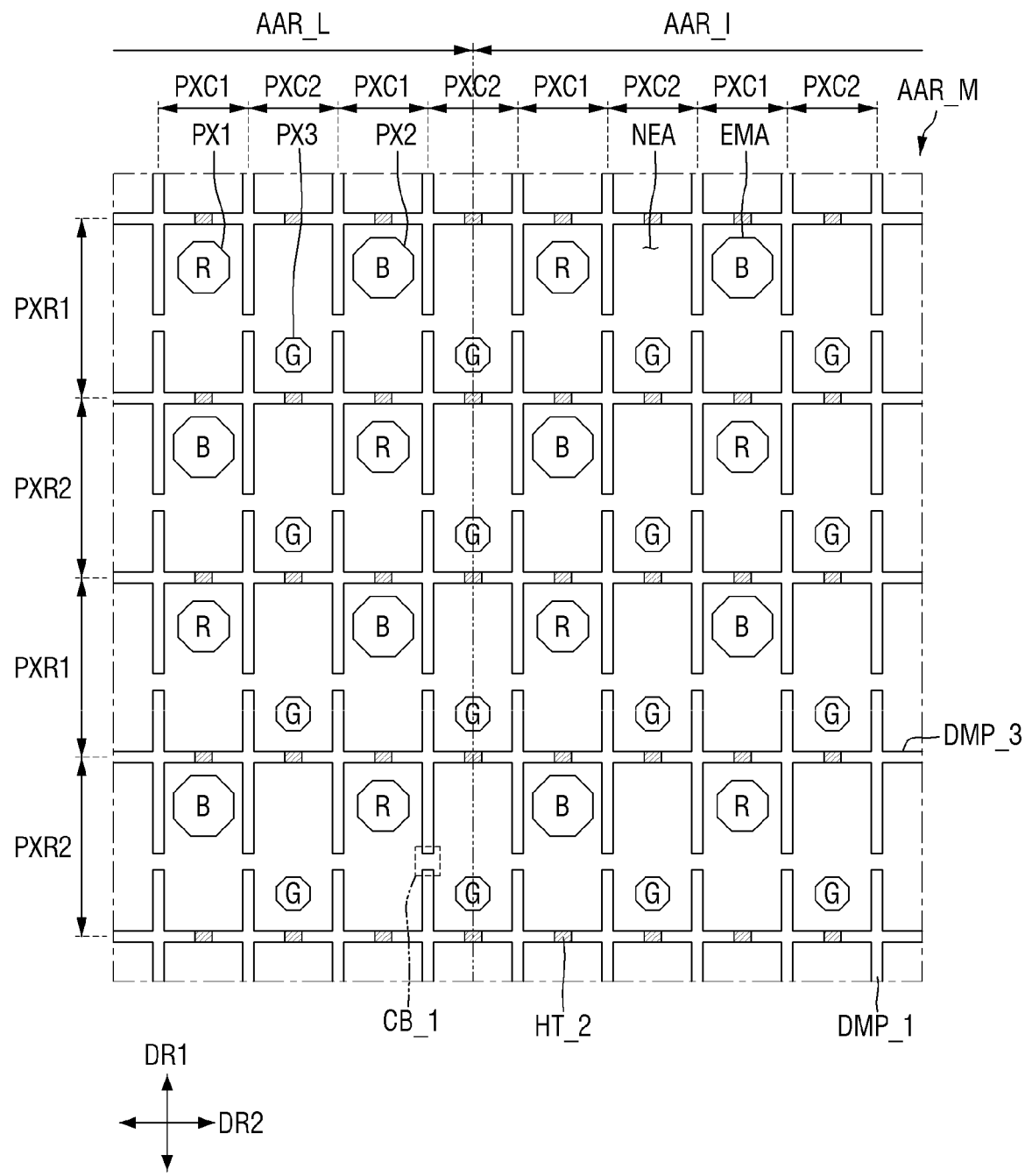
FIG. 24 is a diagram showing a portion of a layout of connection wires and dummy wiring patterns in a main active area of a display device according to another exemplary embodiment of the present disclosure.

FIG. 24 is a diagram showing a portion of a layout of connection wires and dummy wiring patterns in a main active area of a display device according to another exemplary embodiment of the present disclosure.

Referring to FIG. 24, a plurality of second dummy grooves HT_2 may be disposed on a third dummy wiring pattern DMP_3 in the main active area AAR_M. The connection wires CNW may be disposed only in the active fan-out area AAR_F, but not in the main active area AAR_M. In such case, the active fan-out area AAR_F and the main active area AAR_M of the active area AAR may be distinguishable depending on the locations of the connection wires CNW. The first dummy wiring pattern DMP_1, the second dummy wiring pattern DMP_2, and the third dummy wiring pattern DMP_3 disposed in each of the active fan-out area AAR_F and the main active area AAR_M may cause a difference in reflectance due to the first and second disconnections CB_1 and CB_2. To prevent this, the plurality of dummy grooves HT_1 and HT_2 may be arranged in the main active area AAR_M in addition to the active fan-out area AAR_F.

The plurality of second dummy grooves HT_2 may overlap each of the third dummy wiring patterns DMP_3 in the main active area AAR_M. The second dummy grooves HT_2 may be arranged in a space between neighboring pixel rows PXR in the second direction DR2. In addition, the second dummy grooves HT_2 may be arranged in a pixel column PXC in the first direction DR1.

As such, the plurality of dummy grooves including the first and second dummy grooves HT_1 and HT_2 disposed in the entire active fan-out area AAR_F where the connection wires CNW is disposed and the main active area AAR_M where the connection wire CNW is not disposed may further prevent an issue of a perceivable pattern in the entirely active area AAR.

Figure 25:
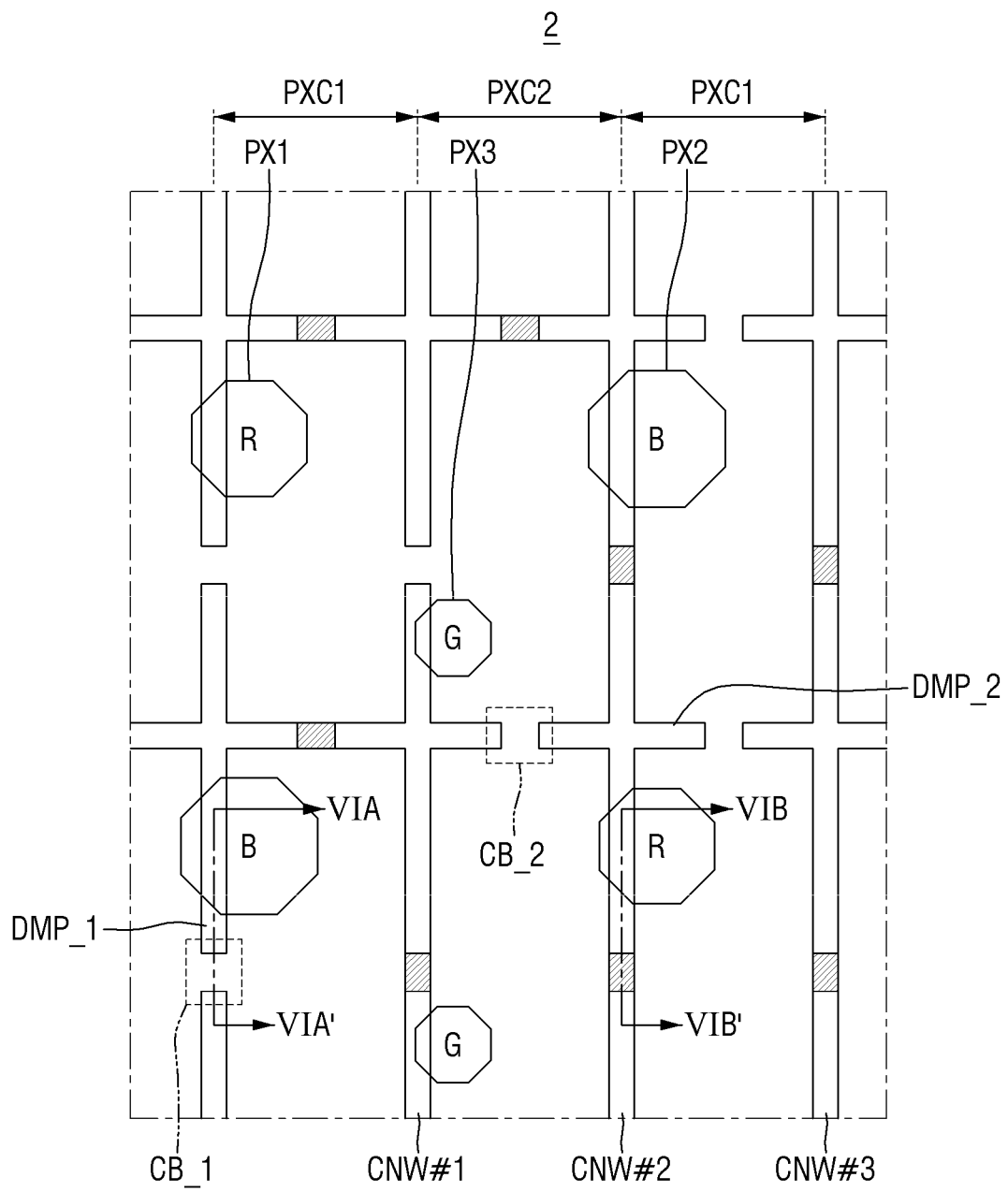
FIG. 25 is a view showing a portion of a layout of some pixels and wires in a display device according to another exemplary embodiment of the present disclosure.
Figure 26:
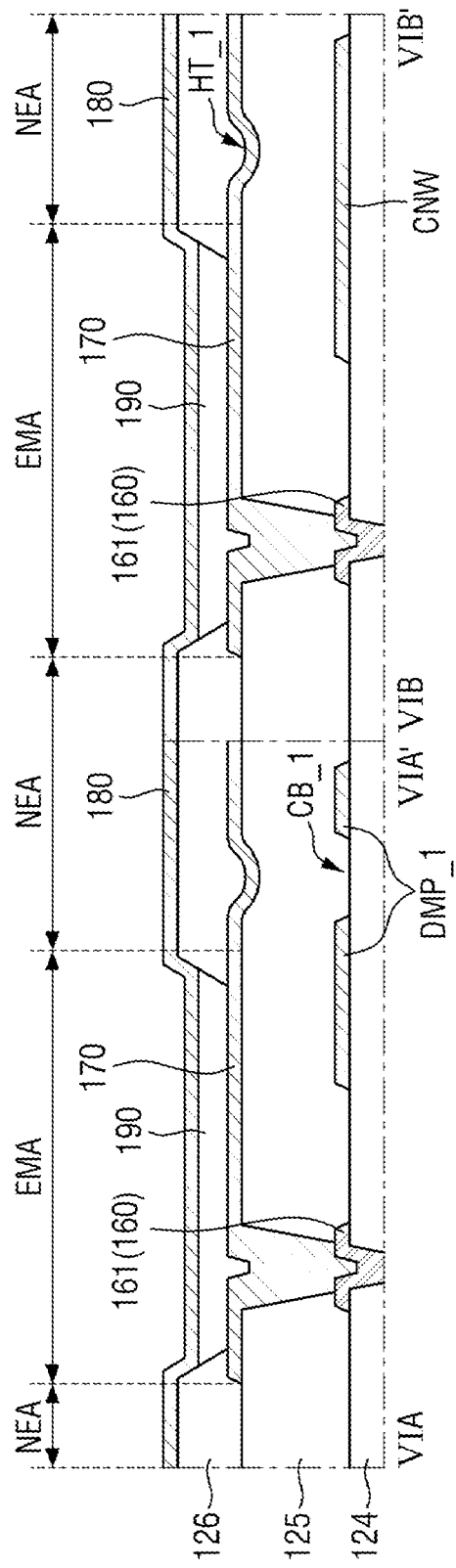
FIG. 26 is a cross-sectional view taken along lines VIA-VIA' and VIB-VIB' of FIG. 25.

FIG. 25 is a view showing a portion of a layout of some pixels and wires in a display device according to another exemplary embodiment of the present disclosure. FIG. 26 is a cross-sectional view taken along lines VIA-VIA' and VIB-VIB' of FIG. 25.

Referring to FIGS. 25 and 26, each of the pixels PX of a display device 2 includes the emission area EMA and the non-emission area NEA. Connection wires CNW and dummy wiring patterns DMP may be disposed on the second data conductive layer 160 to overlap the emission area EMA. Portions of the connection wires CNW and the dummy wiring patterns DMP extending in the first direction DR1 may overlap the emission area EMA (see FIG. 11) of the first color pixel PX1, the second color pixel PX2, and the third color pixel PX3 (see FIG. 25). This exemplary embodiment is different from the exemplary embodiment of FIG. 11 in that the arrangement of the connection wires CNW and the dummy wiring patterns DMP is different. FIG. 25 shows only some of the pixel columns PXC and the pixel rows PXR.

The connection wires CNW and the dummy wiring patterns DMP may be disposed on the second data conductive layer 160 partially overlapping the pixel electrode 170 and the organic layer 190 disposed thereon in the thickness direction. In a case where the display device 2 is a top-emission type display device, the luminance may not be affected even if the connection wires CNW cross the pixels PX and overlap the emission areas EMA.

The first and second dummy grooves HT_1 and HT_2 disposed on the connection wires CNW and the first and second disconnections CB_1 and CB_2 of the dummy wiring patterns DMP may not overlap the emission area EMA. The pixel electrode 170 disposed on the fifth insulating layer 125 may include portions having an uneven (e.g., curved, recessed, protruded) upper surface due to the first and second dummy grooves HT_1 and HT_2 and the disconnections CB_1 and CB_2, but may have a flat upper surface at other portions including those on which the organic layer 190 is disposed, as they do not overlap the organic layer 190. It is, however, to be understood that the present disclosure is not limited thereto. The dummy grooves HT_1 and HT_2 and the disconnections CB_1 and CB_2 may be located in the emission areas EMA in some embodiments.

Figure 27:
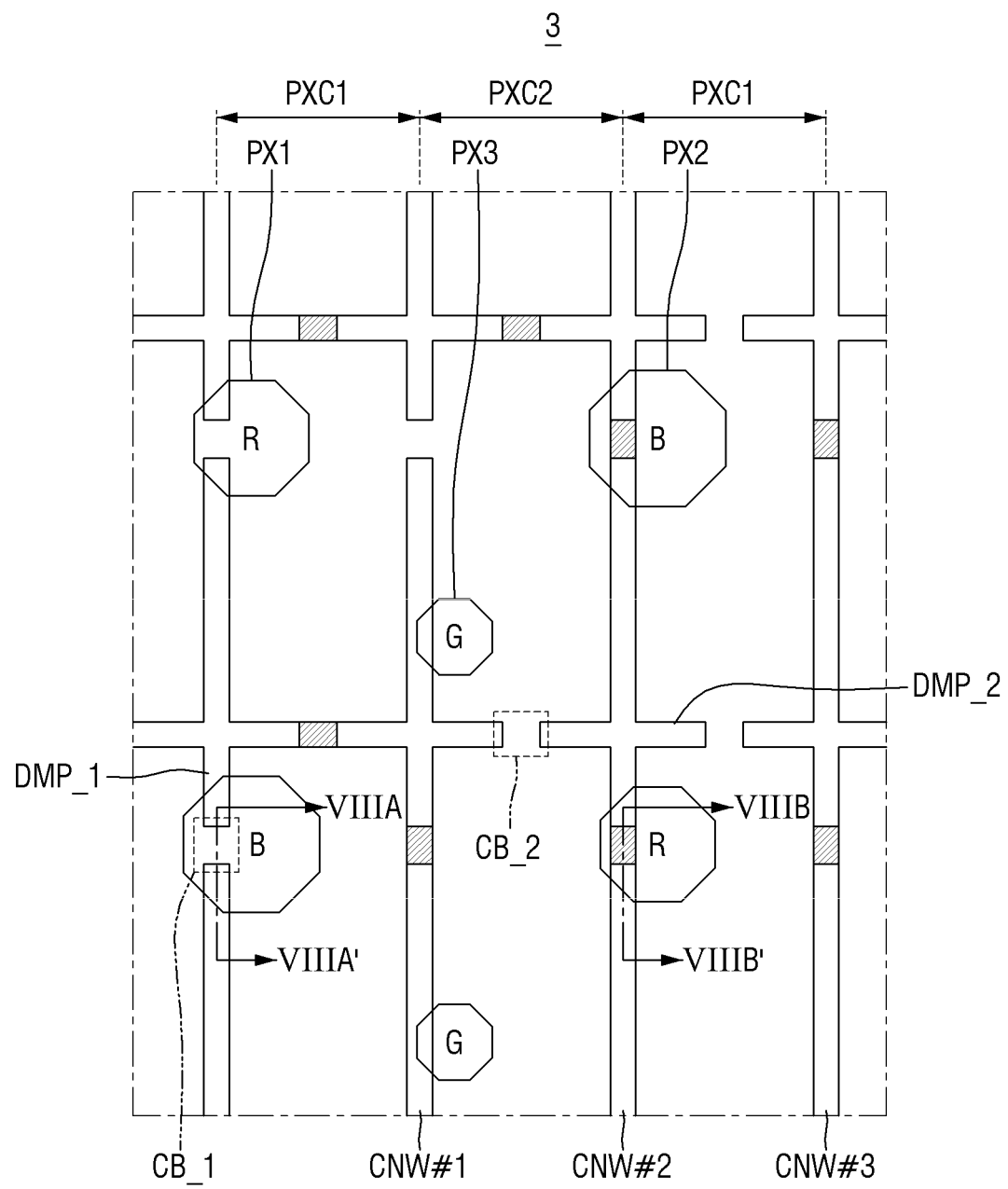
FIG. 27 is a view showing a portion of a layout of some pixels and wires in a display device according to yet another exemplary embodiment of the present disclosure.
Figure 28:
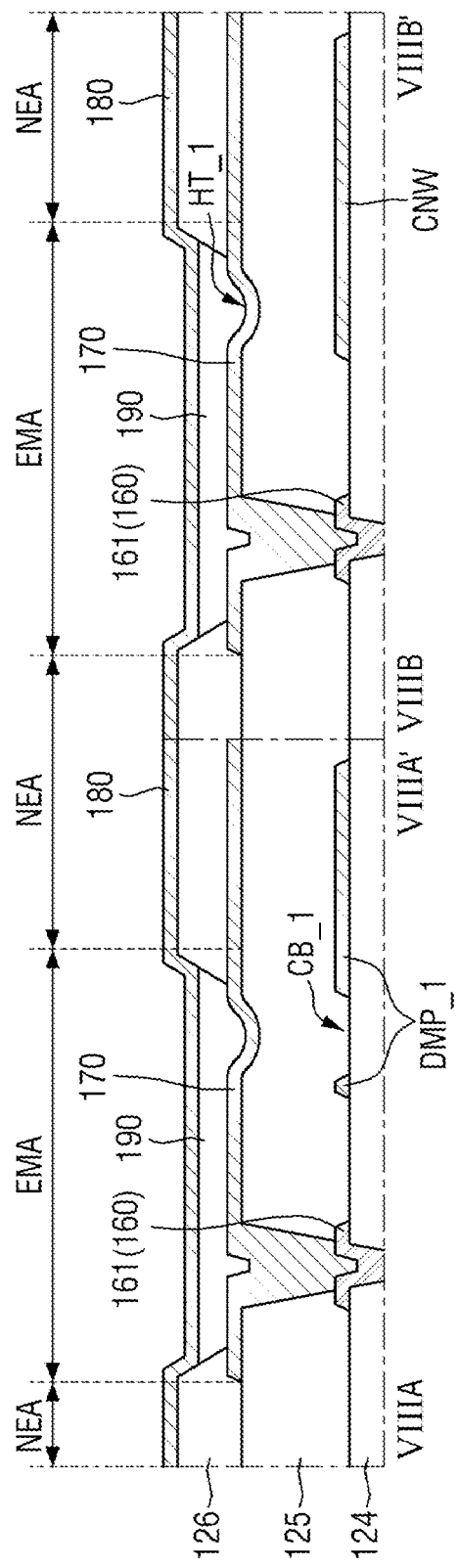
FIG. 28 is a cross-sectional view taken along lines VIIIA-VIIIA' and VIIIB-VIIIB' of FIG. 27.

FIG. 27 is a view showing a portion of a layout of some pixels and wires in a display device according to yet another exemplary embodiment of the present disclosure. FIG. 28 is a cross-sectional view taken along lines VIIIA-VIIIA' and VIIIB-VIIIB' of FIG. 27.

Referring to FIGS. 27 and 28, in a display device 3, the emission areas EMA, the first and second dummy grooves HT_1 and HT_2 disposed above the connection wires CNW, and first and second disconnections CB_1 and CB_2 of the dummy wiring patterns DMP may overlap one another in the thickness direction. The pixel electrode 170 disposed on the fifth insulating layer 125 may have an uneven (e.g., curved, recessed, protruded) upper surface conforming to the pattern of recesses of the fifth insulating layer 125, and the pixel electrode 170 disposed on the organic layer 190 may also have an uneven upper surface as the dummy grooves HT_1 and HT_2 and the disconnections CB_1 and CB_2 overlap the organic layer 190. Since the organic layer 190 includes an organic material, the upper surface may be formed to be flat despite the uneven pattern of the underlying layer. In addition, in a case where the display device 3 is a top-emission type display device, the luminance may not be affected even if the first and second dummy grooves HT_1 and HT_2 and/or the first and second disconnections CB_1 and CB_2 overlap the emission area EMA. The other elements are identical to those described above, therefore, the redundant description will be omitted.

Figure 29:
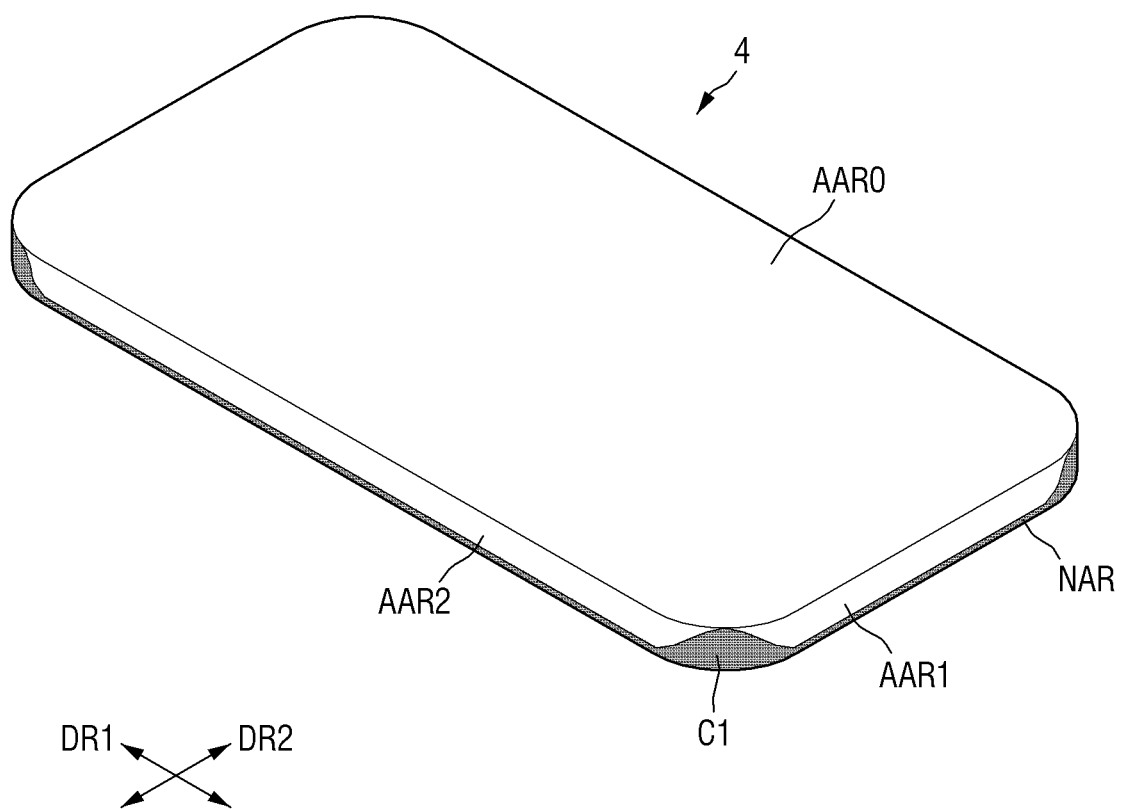
FIG. 29 is a perspective view of a display device according to yet another exemplary embodiment of the present disclosure.
Figure 30:
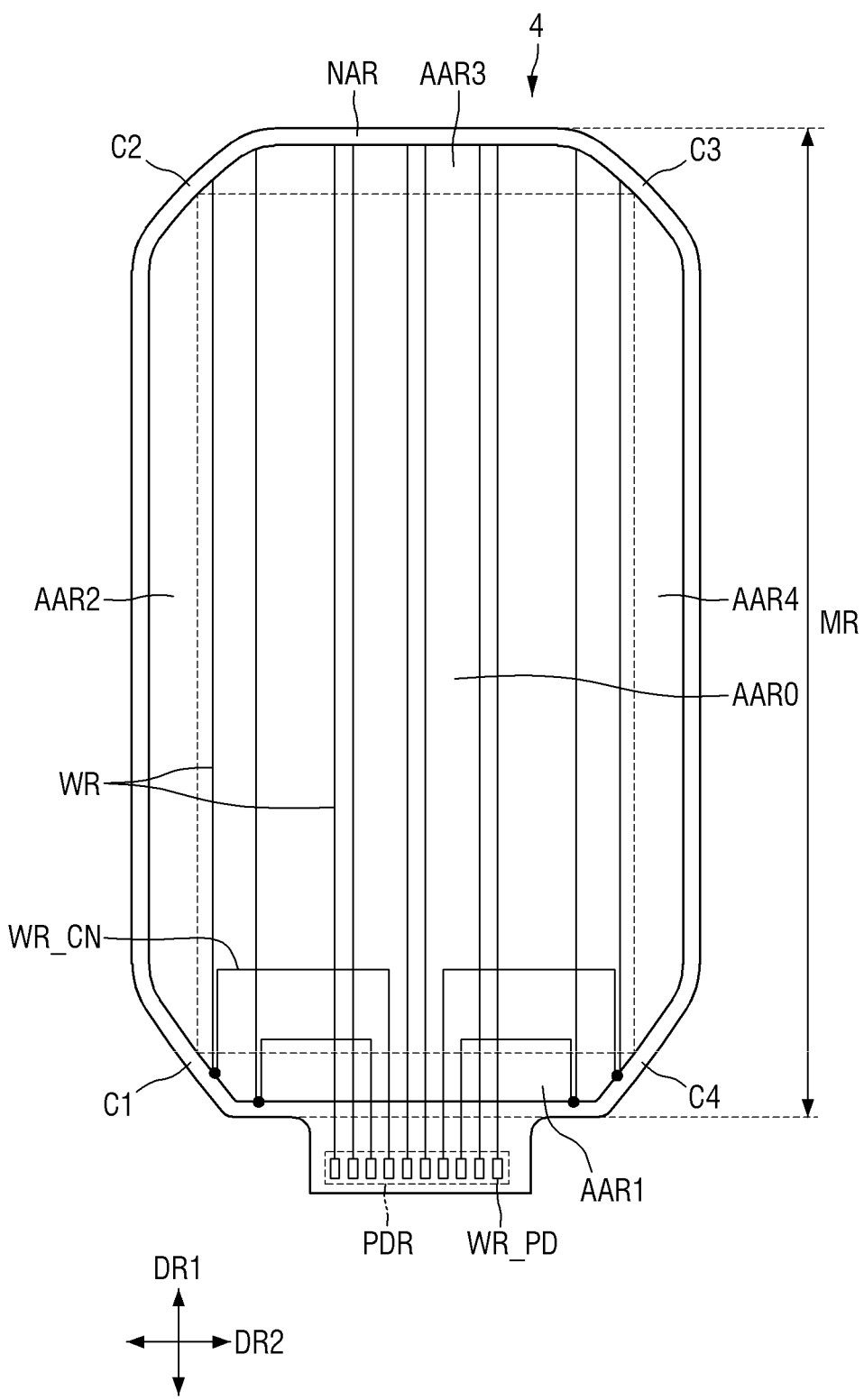
FIG. 30 is a planar view of the display device of FIG. 29.

FIG. 29 is a perspective view of a display device according to yet another exemplary embodiment of the present disclosure. FIG. 30 is a planar view of the display device of FIG. 29.

Referring to FIGS. 29 and 30, a display device 4 according to this exemplary embodiment includes multiple display areas including a front active area AAR0, side active areas AAR1, AAR2, AAR3, and AAR4, and corner areas C1, C2, C3, and C4.

The front active area AAR0 and the side active areas AAR1, AAR2, AAR3, and AAR4 may be the active area AAR where images are displayed. The side active areas AAR1, AAR2, AAR3, and AAR4 may be bent at an angle of 30° to 120° with respect to the front active area AAR0.

The corner areas C1, C2, C3, and C4 may be located between the side active areas AAR1, AAR2, AAR3 and AAR4. The corner areas C1, C2, C3, and C4 may include first to fourth corner area C1, C2, C3, and C4 each located between two of the first to fourth side active areas AAR1, AAR2, AAR3, and AAR4. The first to fourth corner areas C1, C2, C3, and C4 may be disposed adjacent to the four corners of the front active area AAR0, respectively. The first to fourth corner areas C1, C2, C3, and C4 may have similar functions or configurations except for their positions. The corner areas C1, C2, C3, and C4 may correspond to the non-active area NAR that do not display an image, and may provide a space where wires can pass through.

According to the exemplary embodiment, similar to that described with reference to FIG. 6, the width of the pad region PDR may be smaller than the width of the active area AAR. Accordingly, the display device 4 may transmit signals to the first side active area AAR1, the front active area AAR0, and the third side active area AAR3 using the wires WR extending from the pad region PDR via direct-type lines. Due to the insufficient space for the non-active area NAR in the second side active area AAR2 or the fourth side active area AA4, signals may be transmitted thereto via direct-type lines. For example, the display device 4 may transmit signals to the second side active area AAR2 or the fourth side active area AA4 via the indirect-type lines utilizing the routing wires WD_CN that pass through the active area AAR as described above. A detailed description thereon has been given above, therefore, the redundant description will be omitted.

It is understood that those skilled in the art will appreciate that many variations and modifications can be made to the exemplary embodiments without substantially departing from the principles of the present disclosure. Therefore, the exemplary embodiments of the present disclosure disclosed herein are used and understood in a generic and descriptive sense and not for purposes of limitation.

What is claimed is:
1. A display device comprising:
a plurality of pixels;
a substrate comprising an active area in which the plurality of pixels is disposed and a non-active area disposed on a side of the active area;
a first data conductive layer disposed on the substrate and comprising a plurality of signal wires connected to the plurality of pixels;
a first insulating layer disposed on the first data conductive layer;
a second data conductive layer disposed on the first insulating layer and comprising a connection wire connected to some of the plurality of signal wires and a plurality of dummy wiring patterns that is disconnected from the plurality of signal wires;
a second insulating layer disposed on the second data conductive layer; and
a pixel electrode disposed on the second insulating layer,
wherein the plurality of dummy wiring patterns is separated from one another at a disconnection,
wherein the second insulating layer comprises a first portion disposed on the dummy wiring patterns, a second portion disposed on the disconnection, and a third portion disposed on at least a portion of the connection wire, and
wherein a second thickness of the second portion is different from a third thickness of the third portion.

2. The display device of claim 1, wherein an upper surface of the second insulating layer has uneven patterns formed at the second portion and the third portion.

3. The display device of claim 2, wherein the third thickness of the third portion is smaller than the second thickness of the second portion.

4. The display device of claim 3,
wherein the second thickness of the second portion is equal to a first thickness of the first portion, and
wherein the third portion has a dummy groove that is recessed from the upper surface of the second insulating layer.

5. The display device of claim 4,
wherein the second portion of the second insulating layer comprises a recess formed on the upper surface, and
wherein a depth of the dummy groove is equal to a depth of the recess.

6. The display device of claim 4, further comprising:
an emissive layer disposed on the pixel electrode; and
a common electrode disposed on the emissive layer,
wherein the dummy groove overlaps the emissive layer in a thickness direction.

7. The display device of claim 4,
wherein the first thickness of the first portion is equal to the third thickness of the third portion, and
wherein the second portion has a protruding pattern formed on the upper surface.

8. The display device of claim 4,
wherein each of the second portion and the third portion of the second insulating layer comprise a protruding pattern formed on the upper surface, and
wherein the third thickness of the third portion is greater than the first thickness of the first portion.

9. The display device of claim 1, wherein the first portion is disposed on a portion of the connection wire and is connected to the third portion.

10. The display device of claim 1,
wherein at least a portion of the connection wire is disposed in the non-active area and connected to some of the plurality of signal wires passing through the active area, and
wherein the plurality of dummy wiring patterns is disposed only in the active area.

11. The display device of claim 10, wherein a plurality of non-active fan-out wirings is disposed in the non-active area between the first data conductive layer and the substrate.

12. The display device of claim 11, wherein some of the plurality of non-active fan-out wires are directly connected to the plurality of signal wires, and others of the plurality of non-active fan-out wires are connected to the plurality of signal wires through the connection wire.

13. A display device comprising:
an active area in which a plurality of pixels is disposed and arranged in a matrix, and a non-active area disposed on a side of the active area in a first direction and including a pad region,
a plurality of non-active fan-out wires disposed in the non-active area and connected to the pad region;
a plurality of signal wires extending in the first direction to cross the active area and connected to the plurality of pixels;
a plurality of connection wires that at least partially passes through the active area and connects some of the plurality of non-active fan-out wires with some of the plurality of signal wires; and
a plurality of dummy wiring patterns disposed in the active area to cross some of the connection wires,
wherein the plurality of connection wires and the plurality of dummy wiring patterns are formed of a conductive layer disposed on a same layer, and
wherein the display device further comprises a plurality of disconnections at which the plurality of dummy wiring patterns is separated, and a plurality of dummy grooves formed on the plurality of connection wires and spaced apart from one another by a same spacing as the plurality of disconnections.

14. The display device of claim 13, wherein the plurality of connection wires comprises a first extension portion and a second extension portion extending in the first direction, and a third extension portion connected to the first extension portion and the second extension portion and extending in a second direction intersecting the first direction.

15. The display device of claim 14, wherein the plurality of dummy wiring patterns comprises first dummy wiring patterns extending in the first direction and crossing the third extension portion of the plurality of connection wires, and second dummy wiring patterns extending in the second direction and crossing the first extension portion or the second extension portion of the plurality of connection wires.

16. The display device of claim 15,
wherein the plurality of disconnections comprises first disconnections formed between the first dummy wiring patterns that are spaced apart from one another in the first direction, and
wherein the plurality of dummy grooves comprises first dummy grooves disposed above the plurality of connection wires and lies on a same line as the first disconnections.

17. The display device of claim 15,
wherein the plurality of dummy wiring patterns further comprises third dummy wiring patterns disposed in the active area and extending in the second direction to cross the first dummy wiring patterns and the plurality of signal wires,
wherein the third dummy wiring patterns do not cross the first extension portion and the second extension portion.

18. The display device of claim 17,
wherein the plurality of disconnections comprises second disconnections formed between the second dummy wiring patterns spaced apart from one another in the second direction, and
wherein the plurality of dummy grooves comprises second dummy grooves disposed above the third dummy wiring patterns and lie on a same line as the second disconnections.

19. The display device of claim 18, wherein at least some of the second dummy grooves are further disposed on the third extension portion.

20. The display device of claim 14,
wherein the active area is divided into an inner active area in which the plurality of non-active fan-out wires overlap in the first direction, and an outer active area in which the plurality of non-active fan-out wires do not overlap, and
wherein the plurality of connection wires passes through the inner active area to be disposed in the outer active area.

21. The display device of claim 20,
wherein the first extension portion of the plurality of connection wires is disposed in the inner active area, the second extension portion of the plurality of connection wires is disposed in the outer active area, and
wherein the third extension portion is disposed from the inner active area to the outer active area.

22. The display device of claim 13, wherein each of the plurality of pixels comprises an emission area and a non-emission area surrounding the emission area, and wherein at least a portion of the plurality of connection wires and the plurality of dummy wiring patterns overlaps the emission area.

23. The display device of claim 22, wherein at least some of the plurality of disconnections and the plurality of dummy grooves overlap the emission area.

24. The display device of claim 13, wherein the plurality of signal wires is formed of a conductive layer disposed below the plurality of connection wires and the plurality of dummy wiring patterns.

* * * * *